US012628326B2

(12) United States Patent (10) Patent No.: US 12,628,326 B2

Matsushita et al. (45) Date of Patent: May 12, 2026

(54) COMPONENT STORAGE SYSTEM, A COMPONENT STOREHOUSE AND A MAGAZINE PREPARATION METHOD

(71) Applicant: YAMAHA HATSUDOKI KABUSHIKI KAISHA, Iwata (JP)

(72) Inventors: Yoichi Matsushita, Iwata (JP); Yoshihiro Otaka, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 614 days.

(21) Appl. No.: 18/254,540

(22) PCT Filed: Dec. 25, 2020

(86) PCT No.: PCT/JP2020/048759

§ 371 (c)(1),
(2) Date: May 25, 2023

(87) PCT Pub. No.: WO2022/137508

PCT Pub. Date: Jun. 30, 2022

(65) Prior Publication Data

US 2024/0015942 A1     Jan. 11, 2024

(51) Int. Cl.
H05K 13/04       (2006.01)
B65G 1/137      (2006.01)
(Continued)

(52) U.S. Cl.
CPC ......... H05K 13/043 (2013.01); B65G 1/1371 (2013.01); H05K 13/021 (2013.01); H05K 13/086 (2018.08)

(58) Field of Classification Search
CPC .. H05K 13/043; H05K 13/021; H05K 13/086; H10P 72/3411; B65G 1/1371;
(Continued)

(56) References Cited

U.S. PATENT DOCUMENTS 4,871,290 A * 10/1989 Kaczynski .......... H10P 72/3411
414/416.03
9,242,799 B1 * 1/2016 O'Brien ............... B65G 1/1371
(Continued)

FOREIGN PATENT DOCUMENTS

JP    2012-134331 A    7/2012
JP    2018-507558 A    3/2018
JP    2019-218157 A    12/2019

OTHER PUBLICATIONS

International Search Report issued in PCT/JP2020/048759; mailed Mar. 23, 2021.

*Primary Examiner* — Donghai D Nguyen

(74) *Attorney, Agent, or Firm* — Studebaker Brackett PLLC

(57) ABSTRACT

The component storehouse storing the tray in the tray storage rack (tray storage part) is notified of the magazine preparation command indicating the component to be held in the slot of the magazine. In response to this, the component storehouse includes the working robot (work implementation part) that conducts a predetermined work including the tray extraction work, the tray placement work, and the pallet insertion work. The working robot prepares the magazine where the component indicated by the magazine preparation command is held in the slot. In this way, it becomes possible to prepare the magazine automatically where the pallet is inserted in the slot with the tray housing the component placed on the pallet, thereby allowing manpower-saving in component replenishment.

20 Claims, 16 Drawing Sheets

(51) Int. Cl.
*H05K 13/02* (2006.01)
*H05K 13/08* (2006.01)

(58) Field of Classification Search
CPC ........... Y10T 29/49126; Y10T 29/5313; Y10T
29/53265
See application file for complete search history.

(56) References Cited

U.S. PATENT DOCUMENTS 10,039,220 B2 * 7/2018 Jacobsson .......... H05K 13/0417
11,350,549 B2 * 5/2022 Suzuki ................. H05K 13/021

* cited by examiner

F I G.   1
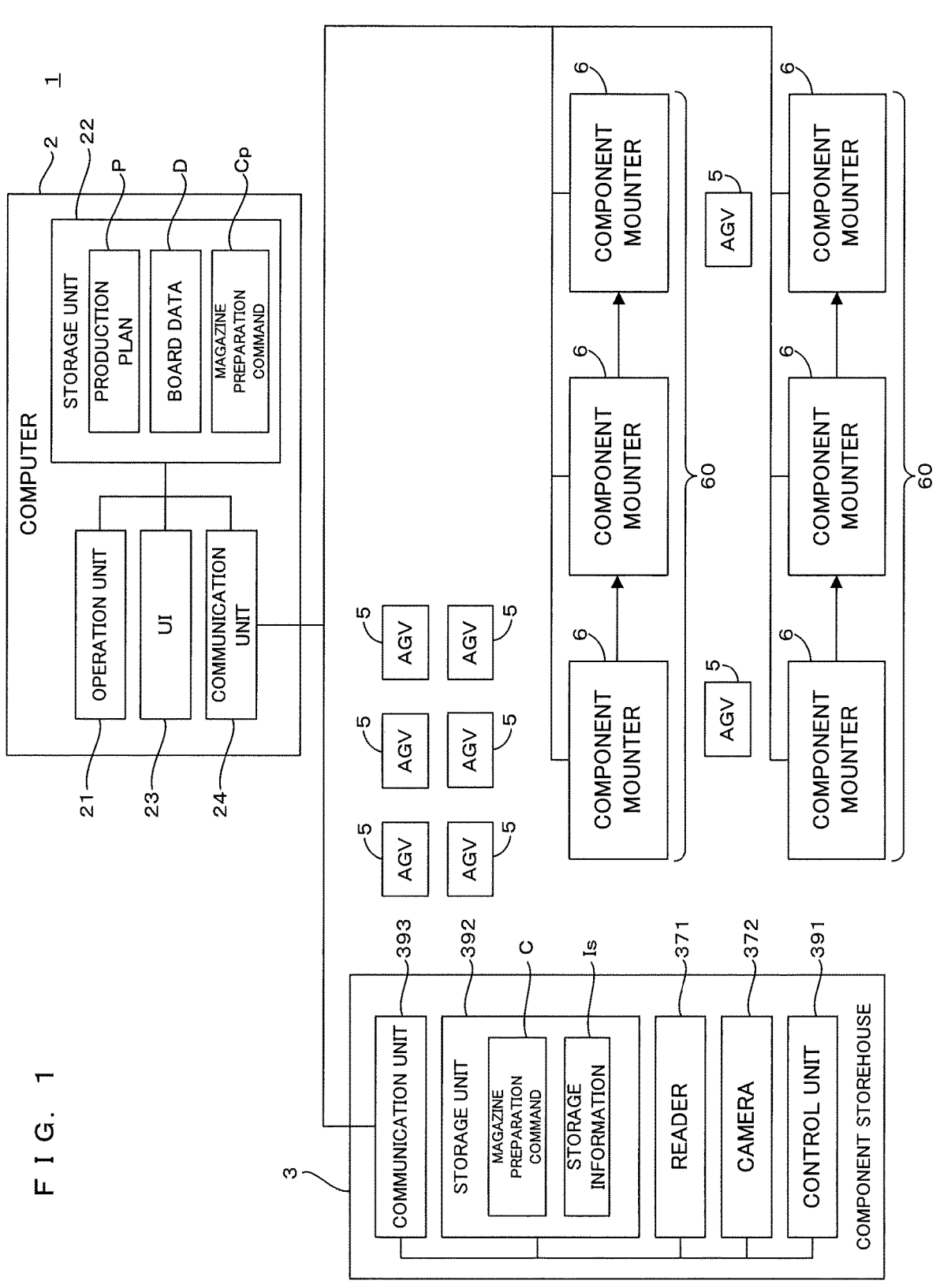

F I G.  2 C
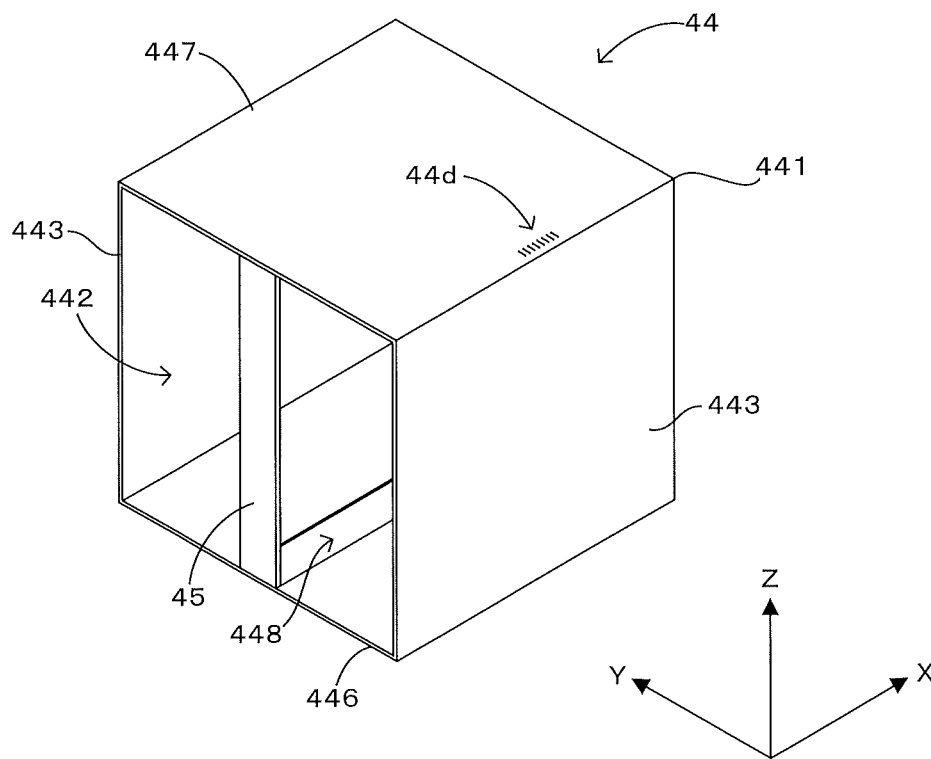

F I G.  3 A
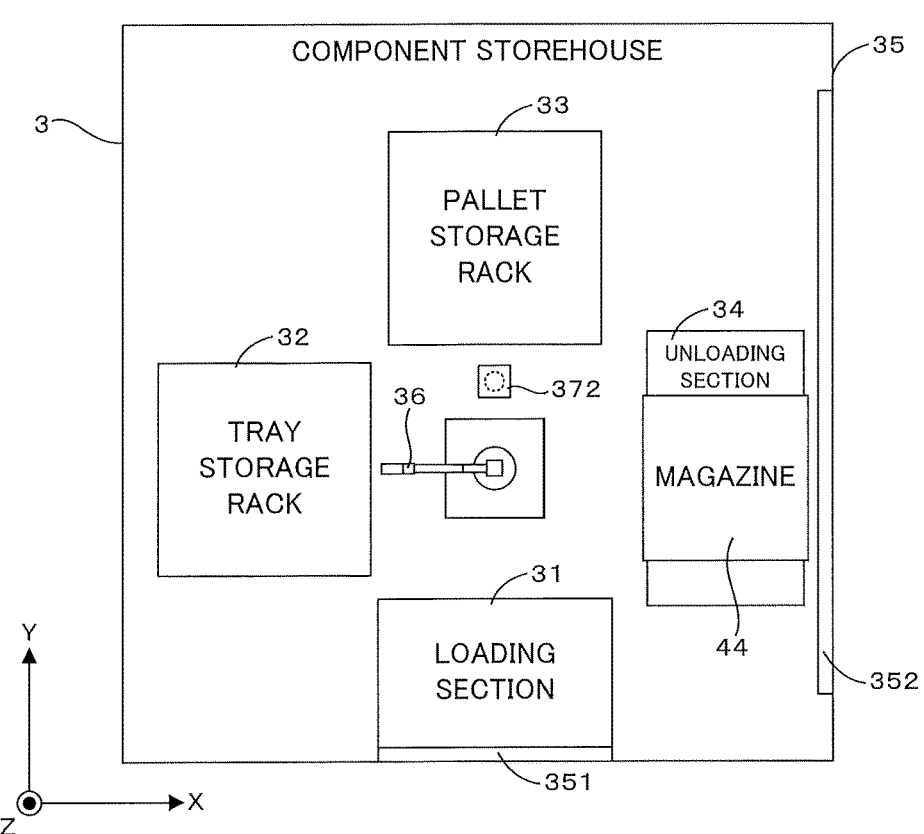
F I G.  3 B
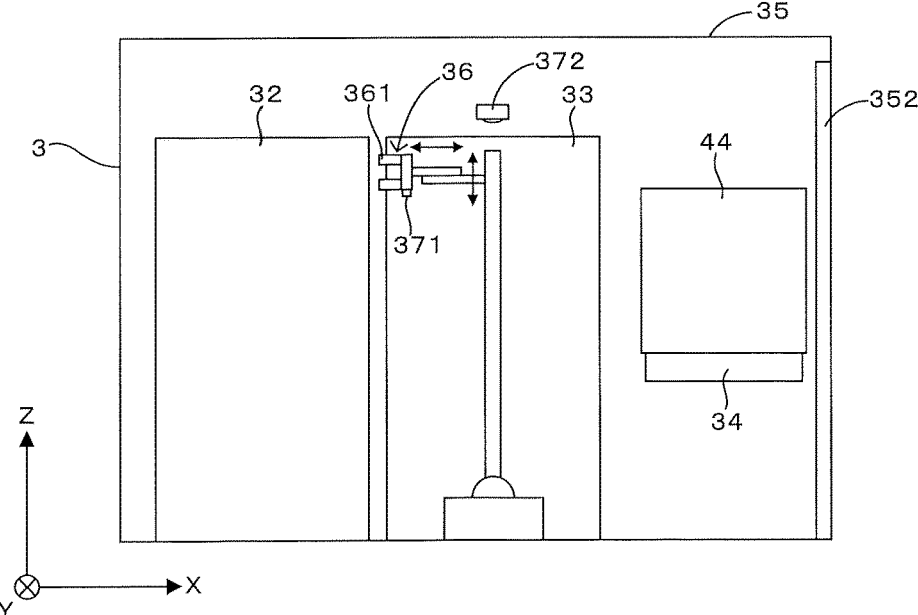

F I G. 4
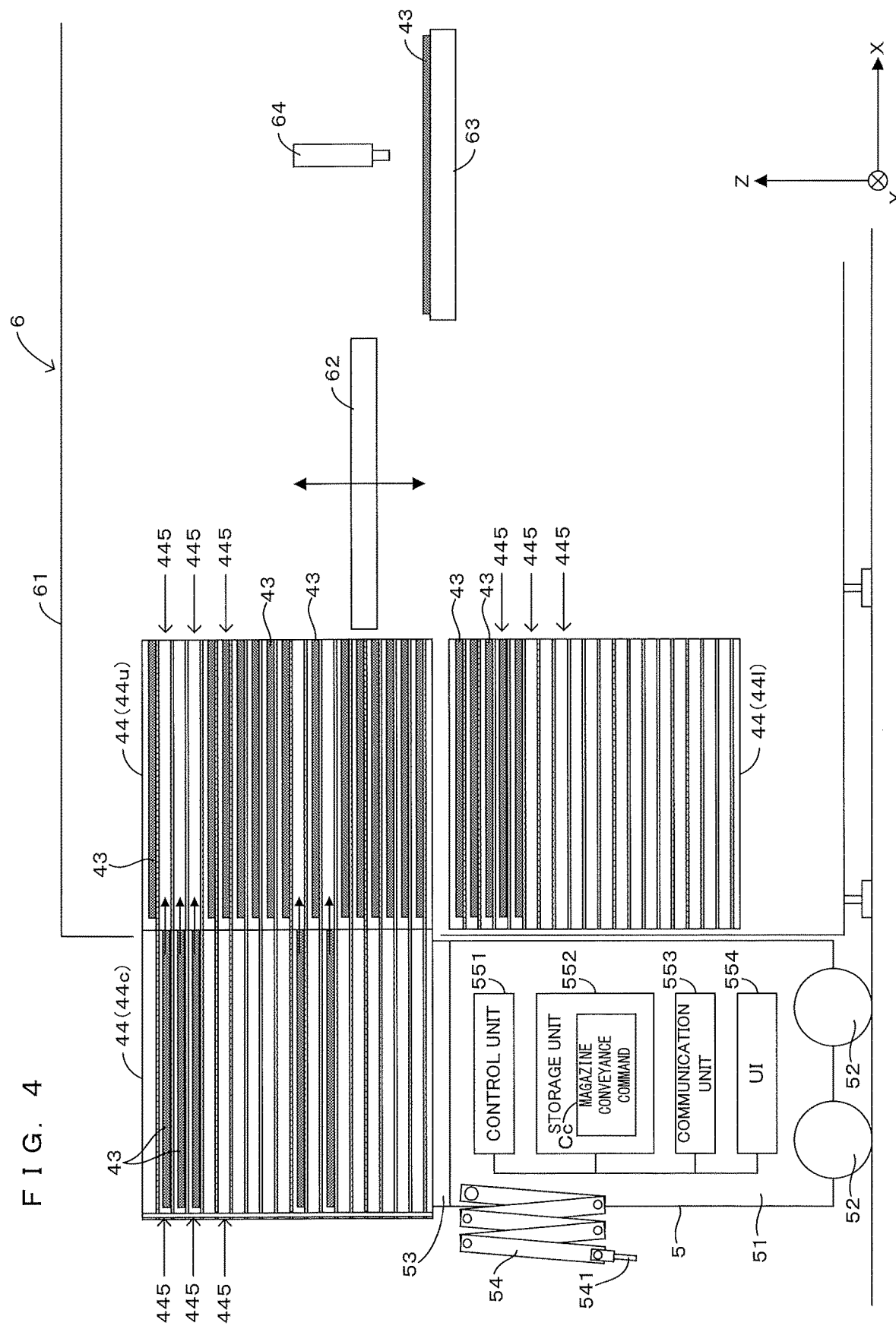

F I G. 5

MAGAZINE CONFIGURATION INFORMATION

| SLOT NUMBER | PALLET CONFIGURATION INFORMATION | | | | | | RELAY POINT | DESTI-NATION | STATE |
| | COMPONENT NAME | COMPONENT ID | TRAY ID | TRAY SHELF NUMBER | PALLET ID | PALLET SHELF NUMBER | | | |
|---|---|---|---|---|---|---|---|---|---|
| 1 | ⋮ | ⋮ | ⋮ | ⋮ | ⋮ | ⋮ | 3a | ⋮ | ⋮ |
| 2 | ⋮ | ⋮ | ⋮ | ⋮ | ⋮ | ⋮ | 3a | ⋮ | ⋮ |
| 3 | ⋮ | ⋮ | ⋮ | ⋮ | ⋮ | ⋮ | 3b | ⋮ | ⋮ |
| 4 | ⋮ | ⋮ | ⋮ | ⋮ | ⋮ | ⋮ | 3b | ⋮ | ⋮ |
| 5 | ⋮ | ⋮ | ⋮ | ⋮ | ⋮ | ⋮ | 3c | ⋮ | ⋮ |
| 6 | ⋮ | ⋮ | ⋮ | ⋮ | ⋮ | ⋮ | 3a | ⋮ | ⋮ |
| 7 | ⋮ | ⋮ | ⋮ | ⋮ | ⋮ | ⋮ | 3b | ⋮ | ⋮ |
| 8 | ⋮ | ⋮ | ⋮ | ⋮ | ⋮ | ⋮ | 3c | ⋮ | ⋮ |

F I G. 6

COMPONENT INFORMATION

| BOARD VARIETY | PRODUCTION NUMBER | PRODUCTION ORDER | SLOT NUMBER | COMPONENT NAME | COMPONENT ID | TRAY ID | PALLET ID | REQUIRED COMPONENT NUMBER | MOUNTING CYCLE |
|---|---|---|---|---|---|---|---|---|---|
| Bk(1) | Bn(1) | 1 | 1 | Pa | 41d_1 | 42d_1 | 43d_1 | Pn(1) | Pcy(1) |
| | | | 2 | | 41d_2 | 42d_2 | 43d_2 | | |
| | | | 3 | Pb | 41d_3 | 42d_3 | 43d_3 | Pn(2) | Pcy(2) |
| | | | 4 | | 41d_4 | 42d_4 | 43d_4 | | |
| | | | … | … | … | | | … | … |
| … | … | … | | | | | | … | … |

F I G. 7

| BOARD VARIETY | MAGAZINE ID | SLOT NUMBER | COMPONENT NAME | COMPONENT ID | TRAY ID | PALLET ID | TOTAL REMAINING NUMBER | WARNING REMAINING NUMBER |
|---|---|---|---|---|---|---|---|---|
| Bk(1) | 44d_a1 | 1 | Pa | 41d_1 | 42d_1 | 43d_1 | Prt(1) | Pre(1) |
|  |  | 2 |  | 41d_2 | 42d_2 | 43d_2 | Prt(2) | Pre(2) |
|  |  | 3 | Pb | 41d_3 | 42d_3 | 43d_3 |  |  |
|  |  | 4 |  | 41d_4 | 42d_4 | 43d_4 |  |  |
|  |  | ⋮ | ⋮ | ⋮ |  |  |  |  |
|  |  | ⋮ | ⋮ | ⋮ |  |  |  |  |
|  |  | ⋮ | ⋮ | ⋮ |  |  |  |  |
|  |  | ⋮ | ⋮ | ⋮ |  |  | ⋮ | ⋮ |

F I G. 8

| SLOT | COMPONENT NAME | Bk(1) | Bk(2) | Bk(3) | Bk(4) | Bk(5) |
|------|----------------|-------|-------|-------|-------|-------|
| 1 | Pa | ⊗ | ⊗ |  | ⊗ | ⊗ |
| 2 |  | ⊗ |  |  |  |  |
| 3 | Pb | ⊗ | ⊗ | ⊗ |  | ⊗ |
| 4 |  | ⊗ |  |  |  |  |
| 5 | Pc | ⊗ |  | ⊗ | ⊗ | ⊗ |
| 6 |  |  |  |  |  | ⊗ |
| 7 | Pd |  | ⊗ Tr |  | ⊗ Tr | ⊗ Tr |
| 8 |  |  |  |  |  |  |
| ⋯ | ⋯ |  |  |  |  |  |

F I G. 9
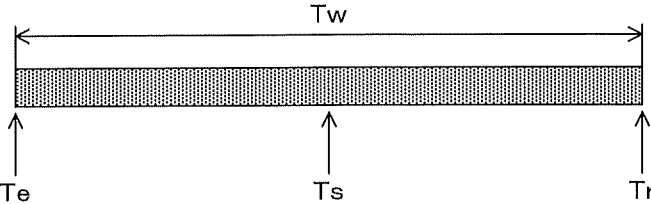

F I G.  1 0
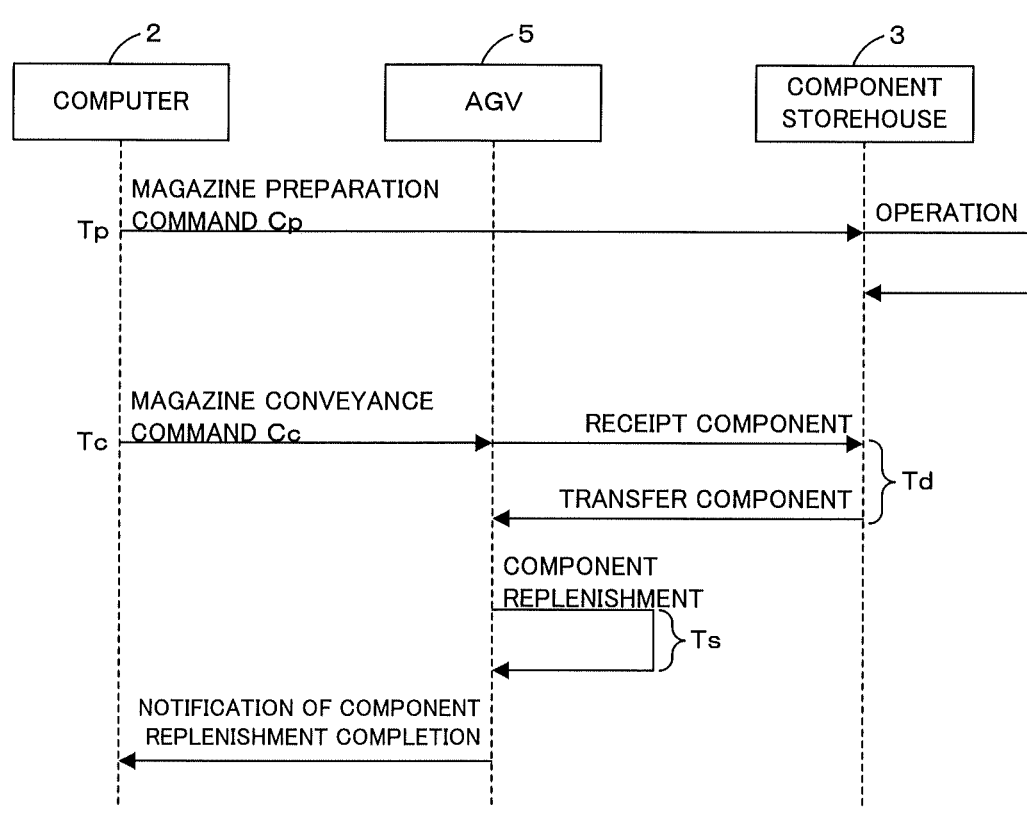

F I G .  1 1

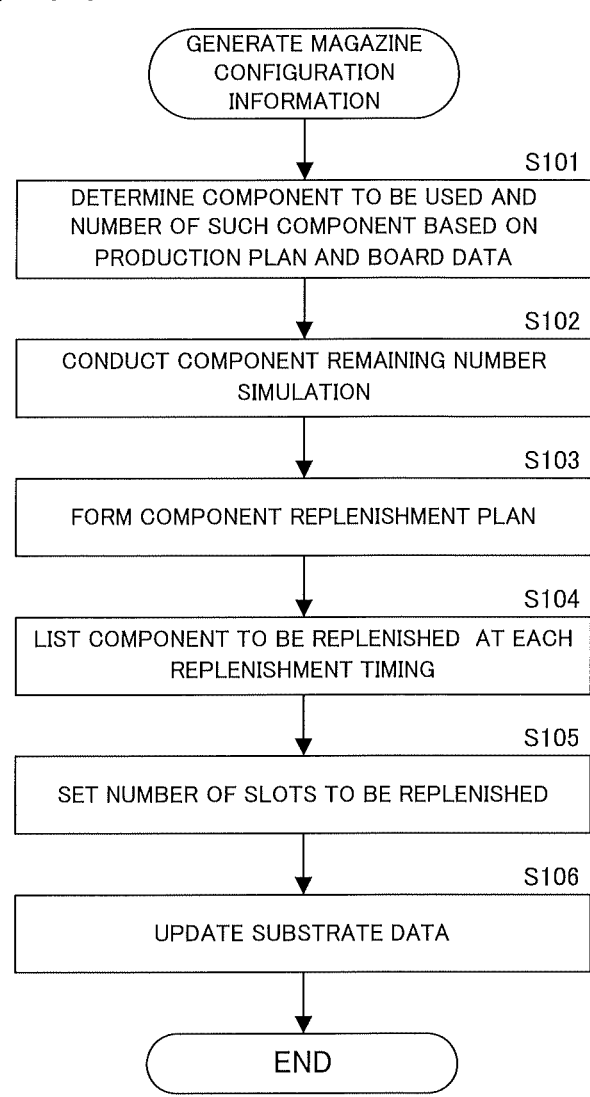

GENERATE MAGAZINE
CONFIGURATION
INFORMATION

S101

DETERMINE COMPONENT TO BE USED AND
NUMBER OF SUCH COMPONENT BASED ON
PRODUCTION PLAN AND BOARD DATA

S102

CONDUCT COMPONENT REMAINING NUMBER
SIMULATION

S103

FORM COMPONENT REPLENISHMENT PLAN

S104

LIST COMPONENT TO BE REPLENISHED  AT EACH
REPLENISHMENT TIMING

S105

SET NUMBER OF SLOTS TO BE REPLENISHED

S106

UPDATE SUBSTRATE DATA

END

F I G. 1 2 A
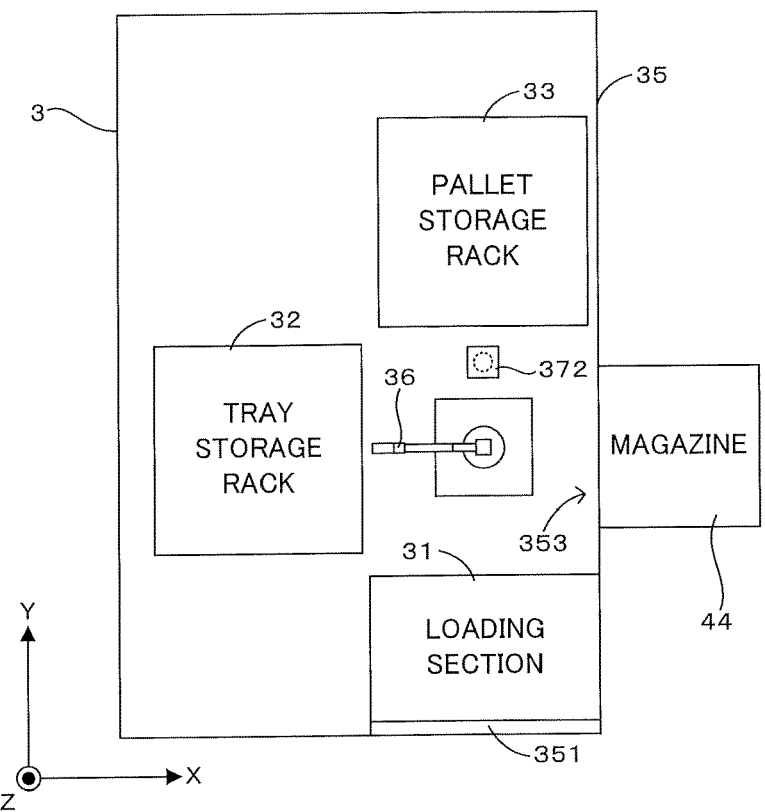
F I G. 1 2 B
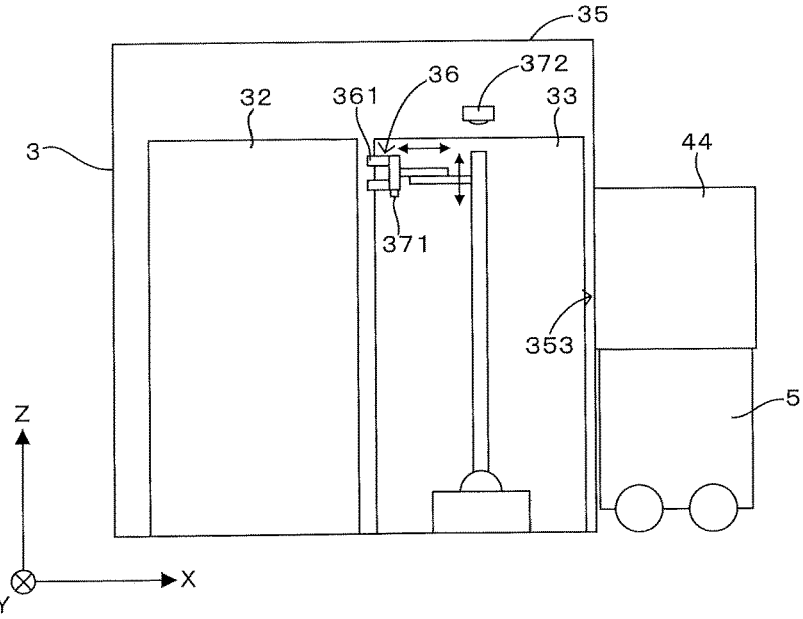

F I G. 1 3
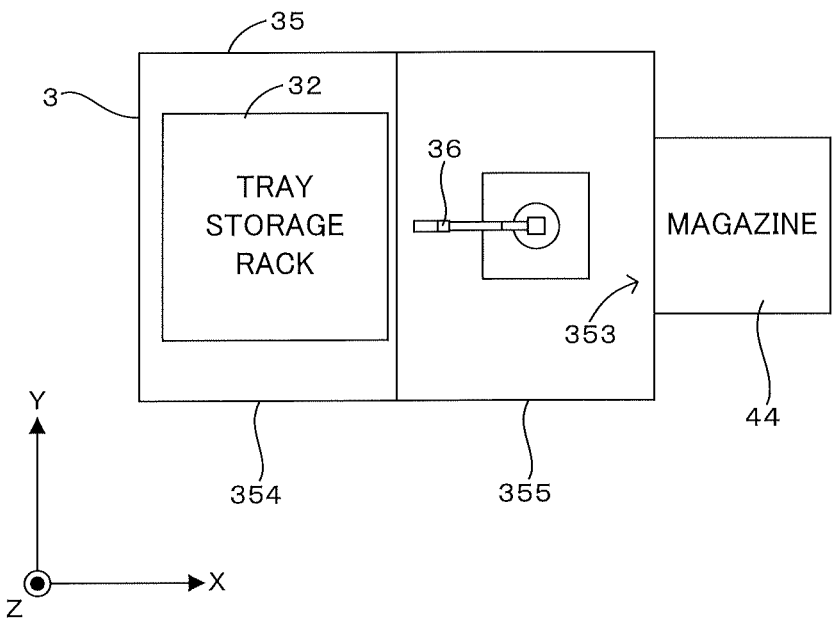

F I G. 1 4 A
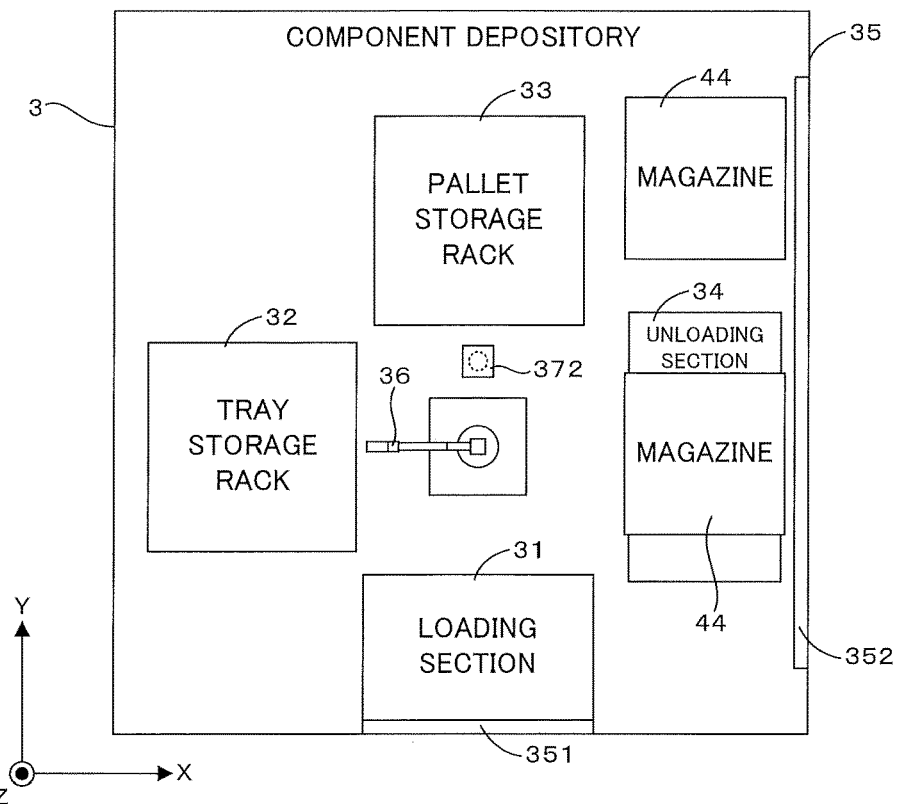
F I G. 1 4 B
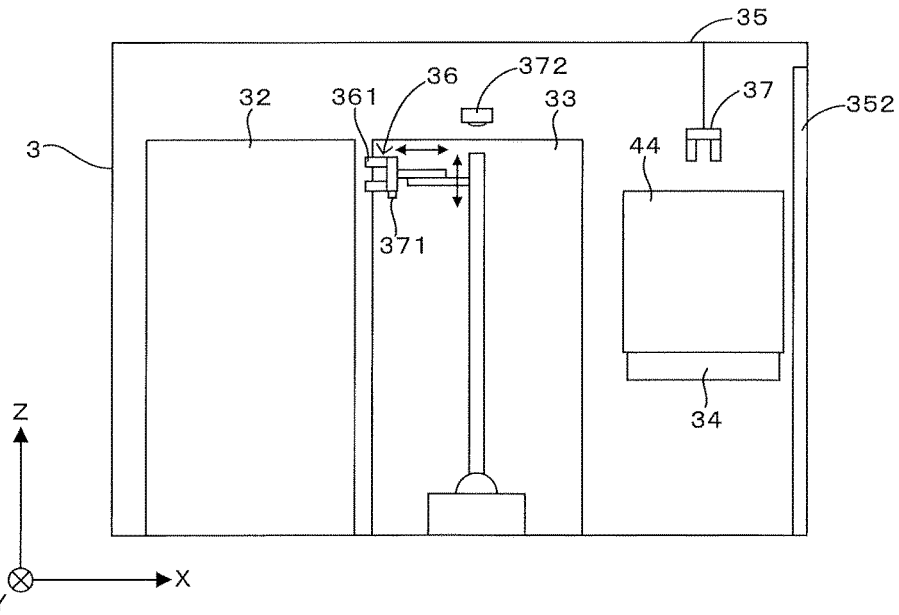

F I G. 1 5

| STATUS | MEANING | WRITE | READ | ACTION |
|---|---|---|---|---|
| −1 | STOP | | | |
| 0 | START | COMPUTER | AGV | INSTRUCT AGV TO MOVE TO COMPONENT STOREHOUSE |
| 1 | ON THE MOVE | AGV | | |
| 2 | ARRIVING | AGV | COMPONENT STOREHOUSE | INSTRUCT COMPONENT STOREHOUSE TO COLLECT |
| 3 | DURING COLLECTION | COMPONENT STOREHOUSE | AGV | LINK AGV TO COMPONENT STOREHOUSE |
| 4 | COLLECTION COMPLETE | COMPONENT STOREHOUSE | AGV | INSTRUCT AGV TO MOVE TO COMPONENT MOUNTER |
| 5 | ON THE MOVE | AGV | | |
| 6 | ARRIVING | AGV | | |
| 7 | DURING REPLENISHMENT | AGV | | |
| 8 | REPLENISHMENT COMPLETE | AGV | | INSTRUCT AGV TO MOVE |

COMPONENT STORAGE SYSTEM, A COMPONENT STOREHOUSE AND A MAGAZINE PREPARATION METHOD

CROSS-REFERENCE TO RELATED APPLICATION

This application is a National Stage of International Patent Application No. PCT/JP2020/048759, filed Dec. 25, 2020, the entire contents of which is incorporated herein by reference.

BACKGROUND

Technical Field

The present disclosure relates to a technique of mounting a component on a board, specifically, to a technique of supplying a component housed in a tray placed on a pallet having been pulled out from a slot of a magazine for mounting of the component on a board.

Background Art

A component mounter that produces a component-mounted board by mounting a component on a board is required to be replenished with a component as appropriate. In this regard, various techniques have been suggested for component replenishment. According to JP2012-134331, for example, a component supply jig is picked from a component supply jig storage shelf and placed on a component supply carriage in response to a command from a production system, and the component supply jig is conveyed using the component supply carriage. By doing so, a component arranged at the component supply jig is replenished to a component mounter. According to JP2018-507558, a carrier for a bin load unit for supplying a component is provided with a display and information about the bin load unit is presented on the display. According to JP2019-218157, a component tray received from an intermediate storage is loaded to a carrier cart and a self-propelled transport machine conveys the carrier cart.

SUMMARY

In some cases, the component mounter mounts a component housed in a tray (so-called tray component). Such a component mounter extracts a component from a slot of a magazine having a plurality of slots each configured to hold a component therein, and mounts the component on a board. More specifically, a pallet is insertable into and removable from the slot. While the pallet is inserted in the slot with the tray housing the component placed on the pallet, the component is held on the pallet. Therefore, for component replenishment to such a component mounter, it is preferable that a magazine can be prepared automatically where a pallet is inserted in a slot with a tray housing a component to be mounted by the component mounter placed on the pallet, as it leads to reduction in burden on an operator. By contrast, JP2012-134331 does not give particular consideration to a component requiring a tray, a pallet, and a magazine. Furthermore, JP2018-507558 and JP2019-218157 mainly relate to a technique of conveying a component and do not disclose preparation of a magazine such as that described above.

The present disclosure has been made in view of the above-described problems, and is intended to provide a technique allowing manpower-saving in component replenishment by automatically preparing a magazine having a slot in which a pallet is inserted with a tray housing a component placed on the pallet.

A component storage system according to the disclosure comprises a component storehouse including a tray storage part storing a tray housing a component, and a work implementation part, that holds a pallet on which the tray extracted from the tray storage part is placed, in a slot provided at a magazine; and a controller that controls the component storehouse. The magazine holds the component housed in the tray placed on the pallet in the slot by holding the pallet in the slot, the controller notifies the component storehouse of a magazine preparation command indicating the component to be held in the slot of the magazine, and the work implementation part prepares the magazine where the component indicated by the magazine preparation command is held in the slot.

A component storehouse according to the disclosure comprises a tray storage part storing a tray housing a component; and a work implementation part that holds a pallet on which the tray extracted from the tray storage part is placed in a slot provided at a magazine. The magazine holds the component housed in the tray placed on the pallet in the slot by holding the pallet in the slot, and he work implementation part prepares the magazine where the component indicated by a magazine preparation command is held in the slot, the magazine preparation command indicating the component to be held in the slot of the magazine.

A magazine preparation method according to the disclosure comprises a step of notifying a magazine preparation command indicating a component to be held in a slot of a magazine; and a step of preparing the magazine at a component storehouse including a tray storage part storing a tray housing the component, and a work implementation part that holds a pallet on which the tray extracted from the tray storage part is placed in the slot provided at the magazine. The magazine is prepared by causing the work implementation part to hold the component indicated by the magazine preparation command in the slot.

According to the present disclosure having the above-described configuration (component storage system, component storehouse, and magazine preparation method), the component storehouse storing the tray in the tray storage part is notified of the magazine preparation command indicating the component to be held in the slot of the magazine. In response to this, the component storehouse includes the work implementation part that holds the pallet in the slot provided at the magazine with the tray extracted from the tray storage part placed on the pallet. The work implementation part prepares the magazine where the component indicated by the magazine preparation command is held in the slot. In this way, it becomes possible to prepare the magazine automatically where the pallet is inserted in the slot with the tray housing the component placed on the pallet, thereby allowing manpower-saving in component replenishment.

The component storage system may be configured so that the controller calculates a replenishment timing of replenishing the component to a component mounter on the basis of a production plan by which a component-mounted board is to be produced by causing the component mounter to mount the component on a board, and notifies the component storehouse of the magazine preparation command indicating to implement a preparation of the magazine, where the component to be replenished at the replenishment timing is held in the slot, in conformity with the replenishment timing. In this configuration, it is possible to prepare the magazine where the pallet is inserted in the slot with the tray housing the component placed on the pallet in conformity with the replenishment timing of replenishing the component to the component mounter.

The component storage system may be configured so that the controller notifies the component storehouse of the magazine preparation command requesting a work for preparation of the magazine where the component to be replenished at the replenishment timing is held in the slot to be started before the replenishment timing, and the work implementation part starts the work for preparation of the magazine where the component indicated by the magazine preparation command is held in the slot before the replenishment timing. In this configuration, it is possible to prepare the magazine where the pallet is inserted in the slot with the tray housing the component placed on the pallet readily in conformity with the replenishment timing of replenishing the component to the component mounter.

The component storage system may be configured so that the controller calculates the replenishment timing on the basis of result of simulation conducted to predict temporal change in the remaining number of the components at the component mounter mounting the component on the board in conformity with the production plan. In this configuration, it is possible to prepare the magazine where the pallet is inserted in the slot with the tray housing the component placed on the pallet at a proper timing responsive to the temporal change in the remaining number of the components at the component mounter.

The component storage system may be configured so that the magazine is given a magazine ID to identify the magazine, the controller notifies the component storehouse of the magazine ID of the magazine as a target of the magazine preparation command and the magazine preparation command in association with each other, the component storehouse includes a magazine ID reader to read the magazine ID of the magazine having been conveyed to the component storehouse, and the work implementation part holds the component in the slot of the magazine given the magazine ID in response to the magazine preparation command associated with the magazine ID read by the magazine ID reader. In this configuration, on the basis of the magazine ID read by the magazine ID reader, the appropriate component can be held in the slot of the magazine given this magazine ID.

The component storage system may be configured so that the tray is given a component ID to identify a component to be placed on the tray, the magazine preparation command indicates the component ID of the component to be held in the slot of the magazine and the slot in association with each other, and the work implementation part holds the component with the component ID in the slot in conformity with the association between the slot and the component ID indicated by the magazine preparation command. In this configuration, it is possible to hold the component with the component ID associated with the slot properly into this slot.

The component storage system may be configured so that the magazine is given a magazine ID to identify the magazine, the tray is given a component ID to identify a component to be placed on the tray, and the component storehouse stores the magazine, causes the work implementation part to hold the component indicated by the magazine preparation command in the slot of the magazine stored in the component storehouse, and notifies the controller of association between the magazine ID of the magazine and the component ID held in the slot of the magazine. This allows the controller to correctly determine the component held in the slot of the magazine on the basis of the association between the magazine ID and the component ID.

The component storage system may be configured so that the component storehouse further includes a pallet storage part housing the pallet, and the work implementation part places the tray that is the tray stored in the tray storage part and housing the component indicated by the magazine preparation command on one pallet that is the pallet stored in the pallet storage part, and then inserts the one pallet into the slot, thereby preparing the magazine where the component indicated by the magazine preparation command is held in the slot. In this configuration, by inserting the pallet into the slot in an empty state with the tray housing the component placed on the pallet, the magazine can be prepared in the manner described above.

The component storage system may be configured so that the pallet is given a pallet ID to identify the pallet, the component storehouse includes a pallet ID reader to read the pallet ID, the magazine preparation command indicates the component to be held in the slot of the magazine in association with the pallet ID of the pallet inserted in the slot, and the component storehouse reads the pallet ID of the pallet inserted in the magazine having been conveyed to the component storehouse using the pallet ID reader and places the tray housing the component associated with the pallet ID by the magazine preparation command on the pallet, thereby preparing the magazine where the component indicated by the magazine preparation command is held in the slot.

Note that various specific ways for conveying the prepared magazine are assumed. The component storage system may be configured so that the controller causes an automatic guided vehicle to convey the magazine prepared in response to the magazine preparation command to a conveyance destination. The component storage system may be configured so that the controller informs an operator to convey the magazine prepared in response to the magazine preparation command to a conveyance destination.

According to the disclosure, it becomes possible to prepare the magazine automatically where the pallet is inserted in the slot with the tray housing the component placed on the pallet, thereby allowing manpower-saving in component replenishment.

BRIEF DESCRIPTION OF THE DRAWINGS

FIG. 1 is a block diagram showing an example of a component mounting system including a component storage system according to the present disclosure;

FIG. 2C is a perspective view schematically showing a magazine as a working target in the component storehouse;

FIG. 3A is a plan view schematically showing an internal configuration of an example of the component storehouse;

FIG. 3B is a side view schematically showing the internal configuration of the component storehouse in FIG. 3A;

FIG. 4 schematically shows the configurations of the AGV and the component mounter;

FIG. 5 shows exemplary specifics of the magazine configuration information;

FIG. 6 shows exemplary simulation parameters necessary for implementation of the simulation;

FIG. 7 shows exemplary specifics of calculation in the component remaining number simulation;

FIG. 8 shows an example of the component shortage chart indicating a timing when component shortage error occurs;

FIG. 9 shows an example of the replenishment feasible time period;

FIG. 10 shows a timing of each operation performed for preparation of a magazine;

FIG. 11 is a flowchart showing an example of a method of generating the magazine configuration information;

FIG. 12A is a plan view schematically showing an internal configuration of a first modification of the component storehouse;

FIG. 12B is a side view schematically showing the internal configuration of the component storehouse in FIG. 12A;

FIG. 13 is a plan view schematically showing an internal configuration of a second modification of the component storehouse;

FIG. 14A is a plan view schematically showing an internal configuration of a third modification of the component storehouse;

FIG. 14B is a side view schematically showing the internal configuration of the component storehouse in FIG. 14A; and FIG. 15 shows an exemplary technique of sharing a status for synchronization between the operations of the computer.

DETAILED DESCRIPTION

Figure 2A:
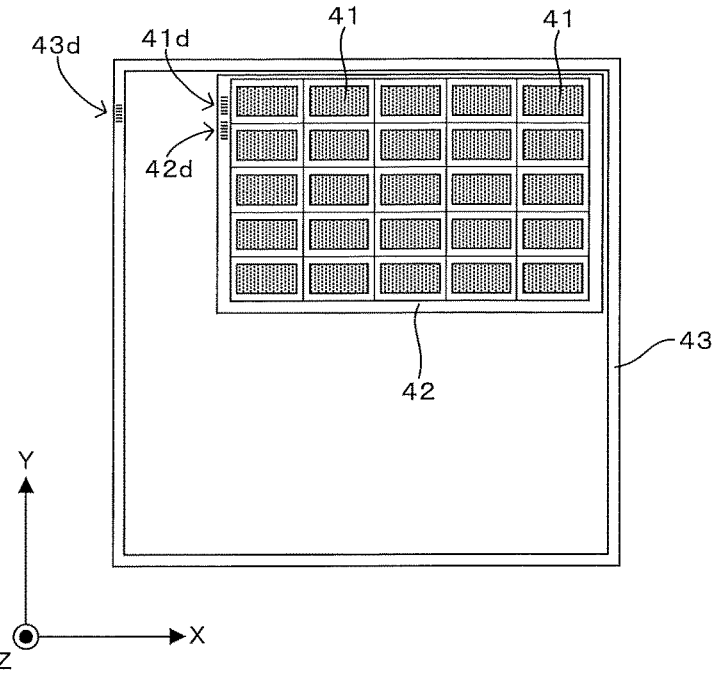
FIG. 2A is a plan view schematically showing a tray and a pallet as working targets in the component storehouse.

FIG. 1 is a block diagram showing an example of a component mounting system including a component storage system according to the present disclosure. A component mounting system 1 mounts a component (electronic component) on a board (printed board) to produce the board (component-mounted board) mounted with the component. The component mounting system 1 includes a computer 2 and a component storehouse 3. The computer 2 and the component storehouse 3 work in cooperation to form an example of a "component storage system" of the present disclosure.

The computer 2 includes an operation unit 21 that is a processor composed of a central processing unit (CPU), a memory, etc., for example, and a storage unit 22 composed of a hard disk drive (HDD), for example. The storage unit 22 stores a production plan P indicating the variety of a board and the number of boards to be produced, and board data D indicating the component name of a component to be mounted on a board of a predetermined board, variety for production of this board (namely, a component type) and the number of the components. If components differ from each other at least in function, shape, and dimension, these components are given different component names. To produce a plurality of board varieties, the board data D is generated for each board variety and stored in the storage unit 22. Furthermore, the computer 2 generates a magazine preparation command Cp on the basis of the production plan P and the board data D and stores the generated magazine preparation command Cp into the storage unit 22. The magazine preparation command Cp will be described later in detail.

The computer 2 further includes a user interface (UI) 23 composed of an input unit such as a keyboard, a mouse, etc., and an output unit such as a display, for example. This allows an operator to input data to the computer 2 by operating the input unit of the UI 23 and to check a content notified by the computer 2 by checking the output unit of the UI 23. The input unit and the output unit are not always required to be configured separately but may be configured integrally as a touch panel display. The computer 2 further includes a communication unit 24 that makes communication with an external device such as the component storehouse 3. The communication unit 24 may make communication either through wire communication or radio communication.

Figure 2B:
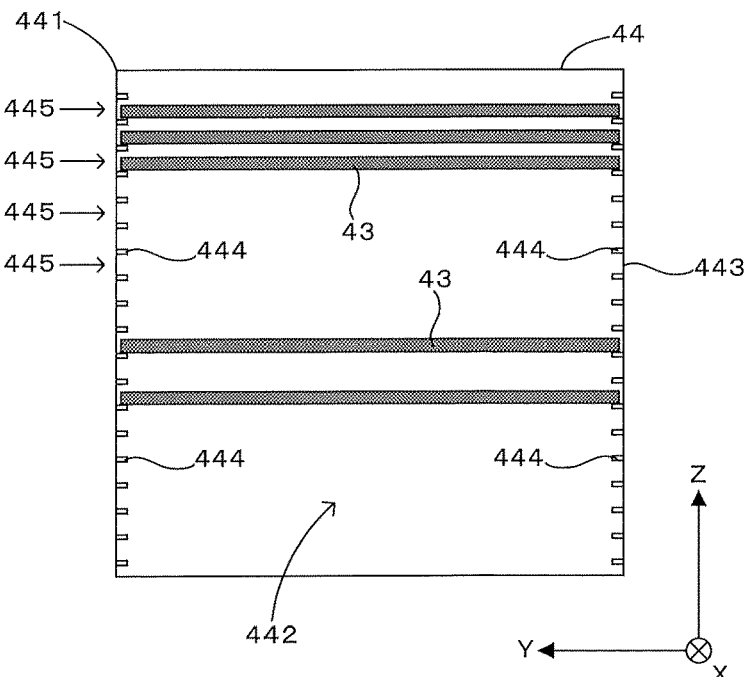
FIG. 2B is a side view schematically showing the pallet and the magazine as working targets in the component storehouse.

FIG. 2A is a plan view schematically showing a tray and a pallet as working targets in the component storehouse. FIG. 2B is a side view schematically showing the pallet and the magazine as working targets in the component storehouse. FIG. 2C is a perspective view schematically showing a magazine as a working target in the component storehouse. These drawings show an X direction as a horizontal direction, a Y direction as a horizontal direction perpendicular to the X direction, and a Z direction as a vertical direction.

As shown in FIG. 2A, a tray 42 houses a plurality of components 41 arranged in a matrix. The tray 42 is given a component ID 41*d* that is a barcode for identifying the component 41 housed in the tray 42, and a tray ID 42*d* that is a barcode for identifying the tray 42. The tray 42 housing the component 41 is placed on a pallet 43. The pallet 43 is given a pallet ID 43*d* that is a barcode for identifying the pallet 43. The pallet 43 with the tray 42 placed thereon is set in a magazine 44.

The magazine 44 includes a rectangular chassis 441. The chassis 441 has openings 442 on opposite sides of an insertion-removal direction (X direction in the illustrations in FIGS. 2B and 2C). The chassis 441 has an upper surface where a magazine ID 44*d* is provided as a barcode for identifying the magazine 44. The chassis 441 has two side plates 443 facing each other in a direction (Y direction in the illustrations in FIGS. 2B and 2C) perpendicular to the insertion-removal direction. Each of the side plates 443 has an inner wall provided with a plurality of protrusions 444 arranged at a regular interval. Two of the protrusions 444 provided at the same height at the respective side plates 443 form a pair to allow the pallet 43 to be supported thereon. Specifically, a place over the protrusions 444 in a pair functions as a slot 445 for insertion of the pallet 43. As described above, the magazine 44 is provided with a plurality of the slots 445 arranged in the Z direction and the pallet 43 inserted in the slot 445 is supported from below by the protrusions 444 in a pair. In this way, the component 41 housed in the tray 42 placed on the pallet 43 is held in the slot 445.

The chassis 441 has a bottom plate 446 and a top plate 447 facing each other in the Z direction. The two side plates 443 are attached to the bottom plate 446 and the top plate 447 in such a manner as to support the top plate 447 relative to the bottom plate 446. The bottom plate 446 and the top plate 447 each have an inner wall provided with a guide groove 448 extending in the insertion-removal direction. The respective guide grooves 448 of the bottom plate 446 and the top plate 447 face each other in the Z direction.

A pallet extrusion jig 45 of a flat-plate shape extending in the Z direction is provided separately from the magazine 44. The pallet extrusion jig 45 can be attached to the magazine 44 by fitting the upper end and the lower end of the pallet extrusion jig 45 into the guide grooves 448. The pallet extrusion jig 45 attached to the magazine 44 in this way is movable along the guide grooves 48 in the insertion-removal direction.

FIG. 3A is a plan view schematically showing an internal configuration of an example of the component storehouse. FIG. 3B is a side view schematically showing the internal configuration of the component storehouse in FIG. 3A. As shown in FIGS. 3A and 3B, the component storehouse 3 includes a loading section 31, a tray storage rack 32, a pallet storage rack 33, an unloading section 34, and a case 35 storing these parts. The case 35 has an loading door 351 for opening and closing the loading section 31, and an unloading door 352 for opening and closing the unloading section 34.

The loading section 31 functions as a work area for a loading work by an operator. Specifically, the operator can load the tray 42 by opening the loading door 351 and placing the tray 42 in the loading section 31. By doing so, the tray 42 housing a full number of the components 41 is loaded in the component storehouse 3. The operator can also load the pallet 43 by opening the loading door 351 and placing the pallet 43 in the loading section 31. By doing so, the pallet 43 in an empty state (namely, the pallet 43 with no tray 42 thereon) is loaded in the component storehouse 3.

The tray storage rack 32 has a plurality of tray shelves arranged in the Z direction. The tray 42 can be inserted into the tray shelf of the tray storage rack 32. The tray 42 can also be pulled out from the tray shelf of the tray storage rack 32. The tray storage rack 32 fulfills the function of storing the tray 42 housing the component 41.

The pallet storage rack 33 includes a plurality of pallet shelves arranged in the Z direction. The pallet 43 can be inserted into the pallet shelf of the pallet storage rack 33. The pallet 43 can also be pulled out from the pallet shelf of the pallet storage rack 33. The pallet storage rack 33 fulfills the function of storing the pallet 43 in an empty state.

The unloading section 34 functions as a place for unloading the magazine 44 prepared in response to the magazine preparation command Cp. Specifically, the magazine 44 put into in the unloading section 34 from the outside through opening of the unloading door 352 is subjected to a magazine preparation work of holding a predetermined tray 42 in a predetermined slot 445 in response to the magazine preparation command Cp. The component storehouse 3 can unload the magazine 44 has undergo the magazine preparation work to the outside from the unloading section 34 through the unloading door 352.

The component storehouse 3 further includes a working robot 36, an ID reader 371, and a camera 372 provided inside the case 35. The working robot 36 is a manipulator with an end effector 361 provided at a tip. The working robot 36 has degrees of freedom in a plurality of directions including the vertical direction, the horizontal direction, and a rotary direction about a rotary shaft parallel to the vertical direction. The working robot 36 conducts works described later by displacing the end effector 361 in these directions. The end effector 361 is a robot hand and used for grasping or releasing a work target. The ID reader 371 is a barcode scanner for reading the above-described IDs (component ID 41d, tray ID 42d, magazine ID 44d) composed of the barcodes, and is attached to the end effector 361 of the working robot 36. The ID is read using the ID reader 371 by moving the end effector 361 of the working robot 36 to the barcode and causing the ID reader 371 to face the ID. The camera 372 is arranged above the working robot 36 and captures an image of a target from above grasped with the end effector 361 of the working robot 36. However, the arrangement of the ID reader 371 and the camera 372 is not limited to this example.

As shown in FIG. 1, the component storehouse 3 includes a control unit 391 composed of a processor or a field-programmable gate array (FPGA), for example, a storage unit 392 composed of a HDD, for example, and a communication unit 393. The storage unit 392 stores storage information Is indicating a storage state of the tray 42 by the tray storage rack 32 and a storage state of the pallet 43 by the pallet storage rack 33. Specifically, the tray shelves of the tray storage rack 32 are given numbers differing from each other (tray shelf numbers), and the storage information Is indicates the number of the tray shelf, and the component ID 41d and the tray ID 42d given to the tray 42 stored in this tray shelf in association with each other. Furthermore, the pallet shelves of the pallet storage rack 33 are given numbers differing from each other (pallet shelf numbers), and the storage information Is indicates the number of the pallet shelf and the pallet ID 43d given to the pallet 43 stored in this pallet shelf in association with each other.

The communication unit 393 communicates with the communication unit 24 of the computer 2, receives the magazine preparation command Cp from the communication unit 24, and stores the received magazine preparation command Cp into the storage unit 392. The magazine preparation command Cp indicates the magazine ID 44d of the magazine 44 to be prepared and magazine configuration information indicating the configuration of the magazine to be prepared in association with each other. The magazine configuration information identifies all of a plurality of the slots 445 using their numbers differing from each other (slot numbers), and indicates the component 41 to be held in the slot 445 and the number of this slot 445 in association with each other. In particular, pallet configuration information described next is used for this association.

Specifically, the magazine configuration information includes the pallet configuration information about the pallet 43 to be used for holding the component 41 in the slot 445. The pallet configuration information indicates the pallet ID 43d of the pallet 43, the tray ID 42d of the tray 42 to be placed on this pallet 43, and the component ID 41d of the component 41 to be housed in this tray 42 in association with each other. The magazine configuration information associates the pallet configuration information about the pallet 43 to be held in the slot 445 and the number of this slot 445 to make association between the component 41 and the slot 445 where this component 41 is to be held. The computer 2 receives the storage information Is in advance from the component storehouse 3. The computer 2 generates the pallet configuration information on the basis of result of check of the component ID 41d and the tray ID 42d given to the tray 42 stored in the tray storage rack 32 and the pallet ID 43d given to the pallet 43 stored in the pallet storage rack 33 using the storage information Is.

The control unit 391 controls the working robot 36, the ID reader 371, and the camera 372 to cause these units to conduct respective operations described next. For example, when the tray 42 is placed in the loading section 31, the control unit 391 causes the ID reader 371 to read the component ID 41d and the tray ID 42d given to this tray 42, and then inserts this tray 42 into the tray shelf of the tray storage rack 32 using the end effector 361. Moreover, the control unit 391 registers these component ID 41d, tray ID 42d and the number of this tray shelf with the storage information Is in association with each other.

When the pallet 43 is placed in the loading section 31, the control unit 391 causes the ID reader 371 to read the pallet ID 43d given to this pallet 43, and then inserts this pallet 43 into the pallet shelf of the pallet storage rack 33 using the end effector 361. Moreover, the control unit 391 registers this pallet ID 43d and the number of this pallet shelf with the storage information Is in association with each other.

When the magazine 44 is placed in the unloading section 34, the control unit 391 causes the ID reader 371 to read the magazine ID 44d given to this magazine 44, and then checks the magazine configuration information associated with this magazine ID 44*d* by the magazine preparation command Cp. Then, the control unit 391 holds the component 41 in the slot 445 in conformity with this magazine configuration information, thereby preparing the magazine 44 having a configuration indicated by the magazine configuration information.

More specifically, on the basis of association between the number of the slot 445 of the magazine 44 and the pallet configuration information, the control unit 391 determines the pallet 43 to be inserted into the slot 445 of this number and the tray 42 to be placed on the pallet 43 and controls the working robot 36 on the basis of result of the determination. Specifically, the control unit 391 identifies a tray shelf housing the tray 42 given the component ID 41*d* and the tray ID 42*d* indicated by the pallet configuration information, and causes the working robot 36 to conduct a tray extraction work of extracting the tray 42 from this tray shelf.

Furthermore, the control unit 391 identifies a pallet shelf housing the pallet 43 given the pallet ID 43*d* indicated by the pallet configuration information, and causes the working robot 36 to conduct a tray placement work of placing the tray 42 extracted by the tray extraction work on the pallet 43 on this pallet shelf. The pallet configuration information includes a tray layout indicating the orientation and location of the tray 42 placed on the pallet 43. The control unit 391 controls the working robot 36 on the basis of an image of the tray 42 extracted by the working robot 36 captured by the camera 372, thereby placing the tray 42 in the orientation and the location indicated by the tray layout.

Moreover, the control unit 391 identifies the slot 445 of a slot number corresponding to the pallet configuration information, and causes the working robot 36 to conduct a pallet insertion work of extracting the pallet 43 to which the tray 42 has been placed by the tray placement work from the tray shelf and insert this pallet 43 into this slot 445. These tray extraction work, tray placement work, and pallet insertion work are conducted on each slot 445 indicated by the magazine configuration information, thereby preparing the magazine 44 where the component 41 indicated by the magazine preparation command Cp is held in the slot 445. The magazine 44 prepared in this way is conveyed by an AGV 5 (Automatic Guided Vehicle) from the unloading section 34 of the component storehouse 3 to a component mounter 6.

Specifically, as shown in FIG. 1, the component mounting system 1 includes a plurality of the component mounters 6. More specifically, two or more (three) component mounters 6 arranged in series form one mounting line 60, and two or more (two) mounting lines 60 are provided. Each component mounter 6 mounts an electronic component such as a capacitor, a resistor, or an integrated circuit on a board (printed board). The electronic component to be mounted by the component mounter 6 includes the component 41 (tray component) supplied by the tray 42 described above.

FIG. 4 schematically shows the configurations of the AGV and the component mounter. As shown in FIG. 4, the AGV 5 includes a vehicle body 51 and a plurality of wheels 52 rotatably attached to the vehicle body 51. The vehicle body 51 moves in response to rotations of the wheels 52. The AGV 5 further includes a carriage 53 attached to the upper surface of the vehicle body 51. The magazine 44 unloaded from the component storehouse 3 is held by the carriage 53. The carriage 53 can move the magazine 44 by being expanded in a direction in which the AGV 5 travels (X direction in the illustration in FIG. 4) by a slide rail mechanism, for example. Furthermore, a working robot 54 is attached to the vehicle body 51. The working robot 54 is a manipulator with an end effector 541 at a tip and displaces the end effector 541 in every direction. The end effector 541 is a robot hand and used for grasping or releasing a work target. In particular, the working robot 54 operates the pallet extrusion jig 45 using the end effector 541.

The AGV 5 further includes a control unit 551, a storage unit 552, a communication unit 553, and a user interface (UI) 554 provided inside the vehicle body 51. The control unit 551 is composed of a processor or a field-programmable gate array (FPGA), for example, and controls operations of the wheels 52 and the working robot 54. The storage unit 552 is composed of a HDD, for example, and stores a magazine conveyance command Cc commanding conveyance of the magazine 44. The control unit 551 controls the wheels 52 on the basis of a conveyance route indicated by the magazine conveyance command Cc, thereby causing the AGV 5 to move along the conveyance route. The communication unit 553 communicates with the communication unit 24 of the computer 2, receives the magazine conveyance command Cc from the communication unit 24, and stores the magazine conveyance command Cc into the storage unit 552. The communication unit 553 can also communicate with the communication unit 393 of the component storehouse 3. The UI 554 is a touch panel display having both a display function and an input function. An operator is allowed to determine a work to be conducted, etc. by checking indication on the UI 554 and to input development of a work, etc. by operating the UI 554.

The component mounter 6 includes a housing 61. The two magazines 44 (44*u*, 44*l*) are arranged in the Z direction inside the housing 61. Of the two magazines 44, the upper magazine 44*u* faces a replenishment opening 611 provided at the housing 61. The pallet 43 replenished from the outside is inserted into the slot 445 of the magazine 44*u*. Specifically, when the AGV 5 arrives at the component mounter 6, the AGV 5 causes the magazine 44 (44*c*) held on the carriage 53 to face the magazine 44*u* across the replenishment opening 611. This causes a plurality of the slots 445 of the magazine 44*c* and a plurality of the slots 445 of the magazine 44*u* to face each other in the X direction. At this time, the pallet 43 held in the slot 445 of the magazine 44*c* faces the slot 445 in an empty state of the magazine 44*u*. Then, the working robot 54 pushes the pallet extrusion jig 45 toward the replenishment opening 611, thereby extruding the pallet 43 held in the magazine 44*c* with the pallet extrusion jig 45 and inserting this pallet 43 into the slot 445 of the magazine 44*u*. In this way, the pallet 43 on which tray 42 housing the component 41 is placed is replenished from the magazine 44*c* to the magazine 44*u*.

As seen from the illustration in FIG. 4, a component is replenished to the magazine 44*u* in the component mounter 6 by replenishing the component 41 from the slot 445 of the magazine 44*c* to the slot 445 in an empty state of a plurality of the slots 445 of the magazine 44*u*. This makes it necessary to prepare the magazine 44*c* in advance that holds the component 41 in the slot 445 to face the slot 445 in an empty state of the magazine 44*u* with the magazine 44*u* and the magazine 44*c* facing each other. The above-described magazine configuration information indicates the configuration of the magazine 44*c* to be prepared in this way. This magazine 44*c* is prepared by the component storehouse 3 by following a procedure described later.

The component mounter 6 includes a pallet pullout part 62 that inserts and removes the pallet 43 into and from the slot 445 of each of the magazines 44*u* and 44*l*, and a component supplier 63 that holds the pallet 43 pulled out by the pallet pullout part 62. The pallet pullout part 62 and the component supplier 63 are provided inside the housing 61. The component mounter 6 further includes a mounting head 64 that extracts the component 41 from the tray 42 on the pallet 43 held by the component supplier 63 and mounts the component 41 on a board. Thus, each time the component 41 is extracted by the mounting head 64, the number of the components 41 housed in the tray 42 on the pallet 43 is reduced.

The pallet pullout part 62 is located between the magazines 44u, 44l and the component supplier 63 in a plan view from the Z direction and moves up and down in the Z direction. The pallet pullout part 62 pulls out the pallet 43 from the slot 445 of the magazine 44u to the component supplier 63, and returns the pallet 43 from the component supplier 63 to the slot 445 of the magazine 44u. Of the two magazines 44u and 44l, the lower magazine 44l fulfills the function of storing the pallet 43 in an empty state. Thus, the pallet 43 in an empty state (namely, the pallet 43 with the tray 42 housing no component 41 placed thereon) is collected by the pallet pullout part 62 from the slot 445 of the magazine 44u or the component supplier 63 to the slot 445 of the magazine 44l.

FIG. 5 shows exemplary specifics of the magazine configuration information. The illustration in FIG. 5 includes only eight slots 445 with numbers from 1 to 8. However, the number of the slots 445 of the magazine 44 is not limited to this example. As described above, the magazine configuration information indicates the number of the slot 445 and the pallet configuration information in association with each other. The pallet configuration information indicates the pallet ID 43d of the associated pallet 43, the number of a pallet shelf where this pallet 43 is housed, the tray ID 42d of the tray 42 to be placed on this pallet 43, the number of a tray shelf where this tray 42 is housed, the component ID 41d of the component 41 housed in this tray 42, and the name of the component 41 housed in the tray 42.

The magazine configuration information further indicates the component storehouse 3 as a relay point storing the pallet 43 given the pallet ID 43d indicated by the pallet configuration information, and the tray 42 given the component ID 41d and the tray ID 42d indicated by the pallet configuration information. Specifically, the component mounting system 1 includes a plurality of the component storehouses 3. Thus, it is required in some cases to pass through two or more component storehouses 3 in order to form the magazine 44 holding the component 41 in each slot 445 in conformity with the magazine configuration information.

As an example, the illustration in FIG. 5 shows component storehouses 3a, 3b, and 3c of a plurality of the component storehouses 3. The component storehouse 3a is associated with the slots 445 with the numbers 1, 2, and 6, The component storehouse 3b is associated with the slots 445 with the numbers 3, 4, and 7, The component storehouse 3c is associated with the slots 445 with the numbers 5 and 8. In this example, on the basis of the magazine configuration information, the operation unit 21 of the computer 2 generates the magazine conveyance command Cc indicating to convey the magazine 44 while passing through the component storehouses 3a, 3b, and 3c sequentially, and transmits the magazine conveyance command Cc to the AGV 5. Then, the AGV 5 moves in response to the received magazine conveyance command Cc.

When the AGV 5 arrives at the component storehouse 3a, the AGV 5 transmits an arrival notification indicating arrival at the component storehouse 3a. The AGV 5 and the component storehouse 3 communicate with each other through the communication unit 553 and the communication unit 393. In response to receipt of the arrival notification, the control unit 391 of the component storehouse 3a opens the unloading door 352 and transmits an open notification indicating this opening to the AGV 5. In response to receipt of the open notification, the AGV 5 brings its vehicle body 51 into contact with the case 35 of the component storehouse 3a. As a result, the vehicle body 51 and the case 35 are fitted to each other at a fit position not shown in the drawings to be located at their positions relative to each other. Next, the AGV 5 makes the carriage 53 expand to unloading section 34 of the component storehouse 3a to place the magazine 44 supported by the carriage 53 into the unloading section 34. For example, the carriage 53 has a mechanism for moving the magazine 44 up and down. After the magazine 44 is moved to a position above the unloading section 34, the magazine 44 is moved down to bring the bottom surface of the magazine 44 into contact with the unloading section 34. In this way, the magazine 44 can be placed in the unloading section 34. A mechanism for placing the magazine 44 in the unloading section 34 is not limited to this example.

When the magazine 44 is placed in the unloading section 34, the control unit 391 of the component storehouse 3a inserts the tray 42 and the pallet 43 responsive to the pallet configuration information associated with the slot 445 indicated by the magazine configuration information into this slot 445 by following the procedure described above. As a result, the tray 42 and the pallet 43 responsive to the associated pallet configuration information are inserted into each of the slots 445 with the numbers 1, 2, and 6. In this way, the component storehouse 3a prepares the magazine 44 where the component 41 indicated by the magazine configuration information is held in each of the slots 445 with the numbers 1, 2, and 6. When preparation of the magazine 44 is completed, the AGV 5 contracts the carriage 53 to extract the magazine 44 from the unloading section 34. Then, the AGV 5 moves to the component storehouse 3b as a next relay point.

When the AGV 5 conveys the magazine 44 to the component storehouse 3b, the magazine 44 is transferred from the AGV 5 to the unloading section 34 of the component storehouse 3b. Then, the tray 42 and the pallet 43 responsive to the associated pallet configuration information are inserted into each of the slots 445 with the numbers 3, 4, and 7. In this way, the component storehouse 3b prepares the magazine 44 where the component 41 indicated by the magazine configuration information is held in each of the slots 445 with the numbers 3, 4, and 6.

When the AGV 5 conveys the magazine 44 further to the component storehouse 3b, the magazine 44 is transferred from the AGV 5 to the unloading section 34 of the component storehouse 3b. Then, the tray 42 and the pallet 43 responsive to the associated pallet configuration information are inserted into each of the slots 445 with the numbers 5 and 8. In this way, the component storehouse 3c prepares the magazine 44 where the component 41 indicated by the magazine configuration information is held in each of the slots 445 with the numbers 5 and 8.

Of a plurality of the component mounters 6, a destination is the component mounter 6 to be replenished with the pallet 43 inserted in the magazine 44. Thus, after passing through all the component storehouses 3a, 3b, and 3c, the AGV 5 conveys the magazine 44 to the component mounter 6 as a destination. Then, the pallet 43 inserted into the magazine 44c at each of the component storehouses 3a, 3b, and 3c is transferred to the magazine 44u provided in the component mounter 6 as a destination. In this way, the component 41 is replenished to the magazine 44 at the component mounter 6.

A state shows whether the pallet 43 is inserted in the slot 445 of the magazine 44. Specifically, when the pallet 43 is inserted into the associated slot 445 of the magazine 44 having been conveyed to the component storehouse 3, the component storehouse 3 causes the communication unit 393 to notify the computer 2 of the insertion of the pallet 43 into this slot 445. Then, the computer 2 updates the magazine configuration information in conformity with the received notification. The magazine configuration information updated in this way is notified to the component storehouse 3 and shared between the computer 2 and the component storehouse 3.

The above-described component replenishment to the magazine 44 at the component mounter 6 can be conducted systematically in conformity with the production plan P. The following describes formation of a component replenishment plan in conformity with the production plan P and operation of the component storehouse 3 based on the component replenishment plan. For formation of this component replenishment plan, the operation unit 21 of the computer 2 simulates operation of producing a component-mounted board by the component mounter 6 in conformity with the production plan P.

FIG. 6 shows exemplary simulation parameters necessary for implementation of the simulation. FIG. 6 shows information (component information) about each board variety Bk(n) and required for the component 41 that is to be held in the magazine 44 for producing Bn(n) number of component-mounted boards of a board variety Bk(n). This component information includes the number of the slot 445 (slot number), a component name (Pa, Pb, etc.), the component ID 41$d$, the tray ID 42$d$, the pallet ID 43$d$, a required component number Pn(m), and a mounting cycle Pcy(m) (m=1, 2, . . . ) in association with each other. Of the simulation parameters in FIG. 6, the board variety Bk(n), the production number Bn(n), and production order n are defined by the production plan P, and the component information is defined by the board data D. The operation unit 21 integrates the production plan P and the board data D with each other to generate the simulation parameters.

At the magazine 44, two or more slots 445 are assigned to the components 41 of the same component name (namely, component variety). For example, two slots 445 with numbers 1 and 2 are assigned to the components 41 of a component name Pa, and two slots 445 with numbers 3 and 4 are assigned to the components 41 of a component name Pb. Specifically, the pallets 43 with the trays 42 housing the components 41 of the same component name placed on the pallets 43 are inserted in two or more slots 445, and these pallets 43 are used sequentially for component supply. Specifically, when the component 41 on one pallet 43 is exhausted, the component on a different pallet 43 is started to be used. The pallet 43 on which the component 41 is exhausted in this way is moved from the magazine 44$u$ to the magazine 44$l$ as described above, so that the slot 445 in the magazine 44$u$ to which the pallet 43 had been inserted becomes empty.

The required component number Pn(m) indicates the number of the components 41 of a corresponding component name required for producing Bn(n) number of component-mounted boards of the board variety Bk(n). The mounting cycle Pcy(m) indicates a cycle of mounting the component 41 of the corresponding component name for producing the component-mounted board of the board variety Bk(n). The mounting cycle Pcy(m) corresponds to a value obtained by dividing a cycle time required for producing one component-mounted board of the board variety Bk(n) by the required component number Pn(m).

The operation unit 91 conducts a simulation on each passage of a predetermined period of time (one second, for example) for calculating the number of the components 41 remaining in each slot 445 of the magazine 44$u$ at the component mounter 6 to operate in conformity with the production plan P (and the board data D). In other words, this simulation is a component remaining number simulation for determining temporal change in the remaining number of the components 41 held in each slot 445. According to the component remaining number simulation, temporal change in the remaining number of the components 41 is determined by executing calculation of subtracting the number of the consumed components 41, obtained by multiplying the predetermined period of time by the mounting cycle Pcy(m), from the number of the components 41 on each passage of the predetermined period of time (remaining number calculation). As two or more slots 445 are assigned to the components 41 of the same component name, the calculated remaining number of the components 41 means a total of the components 41 remaining in the two or more slots 445 associated with the same component name (total remaining number Prt(m)). Specifically, the total remaining number of the components 41 is calculated for each component name.

FIG. 7 shows exemplary specifics of calculation in the component remaining number simulation. FIG. 7 shows a total remaining number Prt(m) and a warning remaining number Pre(m) of the components 41 of the same component name in association with each other. The total remaining number Prt(m) is as described above. The warning remaining number Pre(m) provides a timing of executing component replenishment. For example, a maximum number of the components 41 placed on one pallet 43 is set as the warning remaining number Pre(m). Of two or more slots 445 assigned to the component name about which the total remaining number Prt(m) becomes equal to or less than the warning remaining number Pre(m), at least one of these slots 445 is empty and available for component replenishment through insertion of a new pallet 43. In this way, the warning remaining number Pre(m) provides a timing when component replenishment to the magazine 44 can be started.

The operation unit 91 calculates the total remaining number Prt(m) shown in FIG. 7 on each passage of the predetermined period of time to determine temporal change in the number of components P of each component name (total remaining number Prt(m)). As a result, a component shortage chart shown in FIG. 8 can be obtained.

FIG. 8 shows an example of the component shortage chart indicating a timing when component shortage error occurs. This drawing shows a time axis in the horizontal direction and further schematically shows a period of time when each of board varieties Bk(1), Bk(2), etc. is produced. This drawing shows result about a component shortage timing Tr when the component 41 of each component name becomes zero determined on the basis of the component remaining number simulation. Timings indicated by circles show the component shortage timing Tr. During the component remaining number simulation, calculation is made on the assumption that the pallet 43 to which full number of the components 41 is placed is replenished to the pertinent slot 445 at each component shortage timing Tr. Specifically, the component shortage timing Tr shown in the component shortage chart indicates time when replenishment of the component 41 to the slot 445 becomes necessary in order to avoid component shortage error. Furthermore, the operation unit 91 calculates a time period (replenishment feasible time period) (FIG. 9) when component replenishment can be conducted on the basis of result of the obtained component shortage chart shown in FIG. 8.

FIG. 9 shows an example of the replenishment feasible time period. In FIG. 9, regarding a component name about which the total remaining number Prt(m) becomes equal to or less than the warning remaining number Pre(m), at least one slot 445 assigned to this component name is empty so component replenishment can be started as described above. Specifically, the component 41 may be replenished to this slot 445 between a replenishment start timing Te when the total remaining number Prt(m) becomes equal to or less than the warning remaining number Pre(m) and the component shortage timing Tr. Thus, a time period from the replenishment start timing Te to the component shortage timing Tr is calculated as a replenishment feasible time period Tw. The replenishment feasible time period Tw is calculated about each component name for each component shortage timing Tr.

Then, the operation unit 21 of the computer 2 sets a replenishment timing Ts within the replenishment feasible time period Tw (for example, in the middle of the replenishment feasible time period Tw), and forms a component replenishment plan in such a manner as to replenish the component 41 at the replenishment timing Ts. As the replenishment feasible time period Tw has a duration, the replenishment feasible time periods Tw about two or more component names may overlap each other at least partially. In such a case, the operation unit 21 sets the replenishment timing Ts in a range of the overlap (for example, in the middle of the overlapping range) between the replenishment feasible time periods Tw about these component names, and forms a component replenishment plan in such a manner that the components 41 of these component names are to be replenished collectively at a time at the set replenishment timing Ts. Then, the operation unit 21 transmits the magazine preparation command Cp to the component storehouse 3 so as to allow implementation of component replenishment at the replenishment timing Ts.

FIG. 10 shows a timing of each operation performed for preparation of a magazine. At a preparation start timing Tp, the computer 2 notifies the component storehouse 3 of the magazine preparation command Cp. The component storehouse 3 starts a work in response to the received magazine preparation command Cp. More specifically, the component storehouse 3 checks the magazine configuration information included in the magazine preparation command Cp to see the pallet configuration information about the pallet 43 to be inserted into the slot 445 of the magazine 44 to be conveyed by the AGV 5. Next, the component storehouse 3 waits for arrival of the AGV 5 while conducting the tray extraction work and the tray placement work in conformity with the pallet configuration information. Namely, as described above, preparation of the magazine 44 indicated by the magazine configuration information is completed by implementation of the tray extraction work, the tray placement work, and the pallet insertion work by the component storehouse 3 as described above. Of these works, the tray extraction work and the tray placement work are conducted before arrival of the AGV 5.

Then, the computer 2 notifies the AGV 5 of the magazine conveyance command Cc at a conveyance start timing Tc. The AGV 5 starts moving to the component storehouse 3 in response to the received magazine conveyance command Cc. When the AGV 5 arrives at the component storehouse 3, the component storehouse 3 conducts the pallet insertion work at a transfer timing Td on the magazine 44 having been conveyed to the component storehouse 3 by the AGV 5. In this way, the magazine 44 indicated by the magazine configuration information is prepared by the component storehouse 3.

The magazine 44 prepared in this way is conveyed to the component mounter 6 by the AGV 5. At the replenishment timing Ts, the pallet 43 is inserted from the magazine 44c held by the AGV 5 into the magazine 44u in the component mounter 6 (component replenishment). Then, the AGV 5 transmits a notification of component replenishment completion to the computer 2.

The computer 2 calculates the preparation start timing Tp and the conveyance start timing Tc on the basis of the replenishment timing Ts in such a manner as to conduct component replenishment at the replenishment timing Ts. More specifically, the computer 2 stores time required for the work of moving by the AGV 5 and time required for each of the works including the tray extraction work, the tray placement work, and the pallet insertion work by the component storehouse 3 in advance into the storage unit 392 as work standard time. The conveyance start timing Tc and the replenishment timing Ts are calculated by subtracting the work standard time set for each of works from the replenishment timing Ts. At this time, the conveyance start timing Tc or the replenishment timing Ts may be calculated by subtracting predetermined margin in time in addition to the work standard time from the replenishment timing Ts.

As described above, the magazine preparation command Cp includes the magazine configuration information indicating the configuration of the magazine 44 to be prepared. This magazine configuration information can be generated as follows by the computer 2.

FIG. 11 is a flowchart showing an example of a method of generating the magazine configuration information. The flowchart in this drawing is executed by the operation unit 21 of the computer 2. In step S101, the component 41 to be used in production of a component-mounted board and the number of such components 41 are determined on the basis of the production plan P and the board data D. In step S102, the above-described component remaining number simulation is conducted. In step S103, a component replenishment plan is formed.

In step S104, components to be replenished at each replenishment timing Ts indicated by the component replenishment plan are listed. Then, in step S105, the number of the slot 445 into which each component 41 is to be inserted is set in such a manner that a component to be used earlier is stored in the slot 445 at a higher position at the magazine 44. In some cases, as a result of this number setting of the slot 445, the component 41 is to be inserted into the slot 445 differing from the slot 445 as a destination of insertion of this component 41 indicated by the board data D referred to in step S101. Then, in response to the number setting of the slot 445 in step S105, the board data D is updated (step S106).

According to the above-described embodiment, the component storehouse 3 storing the tray 42 in the tray storage rack 32 (tray storage part) is notified of the magazine preparation command Cp indicating the component 41 to be held in the slot 445 of the magazine 44. In response to this, the component storehouse 3 includes the working robot 36 (work implementation part) that conducts a predetermined work including the tray extraction work, the tray placement work, and the pallet insertion work. The working robot 36 prepares the magazine 44 where the component 41 indicated by the magazine preparation command Cp is held in the slot 445. In this way, it becomes possible to prepare the magazine 44 automatically where the pallet 43 is inserted in the slot 445 with the tray 42 housing the component 41 placed on the pallet 43, thereby allowing manpower-saving in component replenishment.

The computer 2 (controller) calculates the replenishment timing Ts of replenishing the component 41 to the component mounter 6 on the basis of the production plan P by which a component-mounted board is to be produced by causing the component mounter 6 to mount the component 41 on a board. Furthermore, the computer 2 notifies the component storehouse 3 of the magazine preparation command Cp indicating that the magazine 44 where the component 41 to be replenished at the replenishment timing Ts is held in the slot 445 is to be prepared in conformity with the replenishment timing Ts. In this configuration, it is possible to prepare the magazine 44 where the pallet 43 is inserted in the slot 445 with the tray 42 housing the component 41 placed on the pallet 43 in conformity with the replenishment timing Ts of replenishing the component 41 to the component mounter 6.

The computer 2 notifies the component storehouse 3 of the magazine preparation command Cp requesting a work (tray extraction work, tray placement work) for preparation of the magazine 44 where the component 41 to be replenished at the replenishment timing Ts is held in the slot 445 to be started before the replenishment timing Ts (specifically, the magazine preparation command Cp is notified at the preparation start timing Tp). Then, the working robot 36 starts the work (tray extraction work, tray placement work) for preparation of the magazine 44 where the component 41 indicated by the magazine preparation command Cp is held in the slot 445 before the replenishment timing Ts. In this configuration, it is possible to prepare the magazine 44 where the pallet 43 is inserted in the slot 445 with the tray 42 housing the component 41 placed on the pallet 43 readily in conformity with the replenishment timing Ts of replenishing the component 41 to the component mounter 6.

The computer 2 calculates the replenishment timing Ts on the basis of result of simulation conducted to predict temporal change in the remaining number of the components 41 at the component mounter 6 to mount the component 41 on the board in conformity with the production plan P. In this configuration, it is possible to prepare the magazine 44 where the pallet 43 is inserted in the slot 445 with the tray 42 housing the component 41 placed on the pallet 43 at a proper timing responsive to the temporal change in the remaining number of the components at the component mounter 6.

The magazine 44 is given the magazine ID 44d for identifying the magazine 44. The computer 2 notifies the component storehouse 3 of the magazine ID 44d of the magazine 44 as a target of the magazine preparation command Cp and the magazine preparation command Cp in association with each other. Meanwhile, the component storehouse 3 includes the ID reader 371 (magazine ID reader) for reading the magazine ID 44d of the magazine 44 having been conveyed to the component storehouse 3. The working robot 36 holds the component 41 in the slot 445 of the magazine 44 given the magazine ID 44d in response to the magazine preparation command Cp associated with the magazine ID 44d read by the ID reader 371. In this configuration, on the basis of the magazine ID 44d read by the ID reader 371, the appropriate component 41 can be held in the slot 445 of the magazine 44 given this magazine ID 44d.

The tray 42 is given the component ID 41d for identifying the component 41 to be placed on the tray 42. Meanwhile, the magazine preparation command Cp indicates the component ID 41d of the component 41 to be held in the slot 445 of the magazine 44 and the slot 445 in association with each other (pallet configuration information). The working robot 36 holds the component 41 with the component ID 41d in the slot 445 in conformity with the association between the slot 445 and the component ID 41d indicated by the magazine preparation command Cp. In this configuration, it is possible to hold the component 41 with the component ID 41d associated with the slot 445 properly in this slot 445.

The component storehouse 3 includes the pallet storage rack 33 (pallet storage part) housing the pallet 43. The working robot 36 places the tray 42 that is the tray 42 stored in the tray storage rack 32 and housing the component 41 indicated by the magazine preparation command Cp on one pallet 43 that is the pallet 43 stored in the pallet storage rack 33, and then inserts the one pallet 43 into the slot 445, thereby preparing the magazine 44 where the component 41 indicated by the magazine preparation command Cp is held in the slot 445. In this configuration, by inserting the pallet 43 on which the tray 42 housing the component 41 is placed into the slot 445 in an empty state, the magazine 44 can be prepared in the manner described above.

Thus, according to the above-described embodiment, the computer 2 corresponds to an example of a "controller" of the present disclosure, the component storehouse 3 corresponds to an example of a "component storehouse" of the present disclosure, the computer 2 and the component storehouse 3 work in cooperation to function as an example of a "component storage system" of the present disclosure, the tray storage rack 32 corresponds to an example of a "tray storage part" of the present disclosure, the pallet storage rack 33 corresponds to an example of a "pallet storage part" of the present disclosure, the working robot 36 corresponds to an example of a "work implementation part" of the present disclosure, the ID reader 371 corresponds to an example of a "magazine ID reader" of the present disclosure, the component 41 corresponds to an example of a "component" of the present disclosure, the tray 42 corresponds to an example of a "tray" of the present disclosure, the pallet 43 corresponds to an example of a "pallet" of the present disclosure, the magazine 44 corresponds to an example of a "magazine" of the present disclosure, the slot 445 corresponds to an example of a "slot" of the present disclosure, the AGV 5 corresponds to an example of an "automatic guided vehicle" of the present disclosure, the magazine preparation command Cp corresponds to an example of a "magazine preparation command" of the present disclosure, the production plan P corresponds to an example of a "production plan" of the present disclosure, the replenishment timing Ts corresponds to an example of a "replenishment timing" of the present disclosure, the component ID 41d corresponds to an example of a "component ID" of the present disclosure, and the magazine ID 44d corresponds to an example of a "magazine ID" of the present disclosure.

The present disclosure is not limited to the above-described embodiment but various changes can be made to the matter given above within a range not deviating from the purport of the disclosure. For example, in the above-described embodiment, the magazine 44 having been conveyed by the AGV 5 is transferred to the unloading section 34 in the case 35 and the working robot 36 conducts the pallet insertion work on the magazine 44 on the unloading section 34. However, like in a case described next, the unloading section 34 is not always required to be provided in the component storehouse 3.

FIG. 12A is a plan view schematically showing an internal configuration of a first modification of the component storehouse. FIG. 12B is a side view schematically showing the internal configuration of the component storehouse in FIG. 12A. Here, a difference from the matter mentioned above will be described mainly and a part common to that mentioned above will be given a corresponding sign and description thereof will be omitted, as appropriate. This also applies to modifications described later.

The case 35 of the component storehouse 3 according to this modification includes an unloading window 353 having a rectangular shape conforming to the shape of the magazine 44. The unloading window 353 is opened and closed with a door not shown in the drawings. The magazine 44 having been conveyed to the component storehouse 3 by the AGV 5 faces the interior of the case 35 of the component storehouse 3 across the unloading window 353 while contacting the case 35 from the outside. At this time, a peripheral edge of the opening 442 formed at the chassis 441 of the magazine 44 contacts a peripheral edge of the unloading window 353 formed at the case 35 of the component storehouse 3. In doing so, by using a sealing member such as rubber provided at the peripheral edge of the unloading window 353 at the case 35, tight contact may be formed between the case 35 of the component storehouse 3 and the chassis 441 of the magazine 44. Then, the working robot 36 conducts the pallet insertion work on the magazine 44 supported by the AGV 5 outside the case 35.

According to this modification, as a need to provide the unloading section 34 is eliminated, the component storehouse 3 can be reduced in size. Moreover, as a need to transfer the magazine 44 between the AGV 5 and the unloading section 34 is eliminated, shortening of working hours can be encouraged.

FIG. 13 is a plan view schematically showing an internal configuration of a second modification of the component storehouse. The case 35 of the component storehouse 3 according to this modification is divided into a storage section 354 and an intermediate working section 355. The tray storage rack 32 is arranged in the storage section 354. At the tray storage rack 32, the tray 42 housing the component 41 is stored in a state of being placed on the pallet 43. The storage section 354 unloads the pallet 43 with the tray 42 placed thereon toward the intermediate working section 355. The working robot 36 is arranged in the intermediate working section 355. The working robot 36 inserts the pallet 43 having been unloaded from the storage section 354 into the slot 445 of the magazine 44 supported by the AGV 5.

FIG. 14A is a plan view schematically showing an internal configuration of a third modification of the component storehouse. FIG. 14B is a side view schematically showing the internal configuration of the component storehouse in FIG. 14A. The component storehouse 3 according to this modification stores the magazine 44 in the case 35 and can move the magazine 44 in the case 35 using a carrier device 37 composed of a crane, for example. This component storehouse 3 prepares the magazine 44 responsive to the magazine preparation command Cp in a manner described next.

When the component storehouse 3 receives the magazine preparation command Cp, the component storehouse 3 puts the magazine 44 in the case 35 onto the unloading section 34 using the carrier device 37 and reads the magazine ID 44$d$ of this magazine 44 using the ID reader 371. Then, by following the same procedure as that described above, the component storehouse 3 conducts the tray extraction work, the tray placement work, and the pallet insertion work in response to the magazine preparation command Cp, thereby holding the component 41 in the slot 445 of the magazine 44. The control unit 391 of the component storehouse 3 notifies the computer 2 of association between the magazine ID 44$d$ of the magazine 44 and the component ID 41$d$ held in the slot 445 of the magazine ID 44$d$ using the communication unit 393. The component ID 41$d$ can be determined by referring to the storage information Is.

When the AGV 5 arrives at the component storehouse 3, the carrier device 37 of the component storehouse 3 collects the magazine 44 supported by the AGV 5 into the case 35. Next, the carrier device 37 places the magazine 44 prepared at the unloading section 34 onto the AGV 5. The AGV 5 thereafter conveys the magazine 44 to a conveyance destination such as the component mounter 6.

As described above, the magazine 44 indicated by the magazine preparation command Cp is prepared by holding the component 41 in the slot 445 of the magazine 44 stored in the component storehouse 3. This eliminates a need for the AGV 5 to convey the magazine 44 to the component storehouse 3. Furthermore, the computer 2 is notified of association between the magazine ID 44$d$ of the magazine 44 and the component ID 41$d$ held in the slot 445 of the magazine 44. This allows the computer 2 to correctly determine the component 41 held in the slot 445 of the magazine 44 on the basis of the association between the magazine ID 44$d$ and the component ID 41$d$. As a result, on the basis of association between the component mounter 6 to be replenished with the component 41 held in the prepared magazine 44 and the magazine 44, the computer 2 can exert control of causing the AGV 5 to convey the magazine 44 to the associated component mounter 6 and replenishing the component 41 held in the magazine 44 to this component mounter 6.

In the above-described embodiment, the working robot 36 places the tray 42 on the pallet 43 stored in the pallet storage rack 33 and inserts this pallet 43 into the slot 445 of the magazine 44, thereby preparing the magazine 44 indicated by the magazine preparation command Cp. Alternatively, for preparing the magazine 44 indicated by the magazine preparation command Cp, the working robot 36 may place the tray 42 extracted from the tray storage rack 32 onto the pallet 43 inserted in the slot 445 of the magazine 44 having been conveyed to the working robot 36.

In this case, the magazine preparation command Cp indicates the component ID 41$d$ of the component 41 to be held in the slot 445 of the magazine 44 in association with the pallet ID 43$d$ of the pallet 43 inserted in the slot 445. In response to receipt of this magazine preparation command Cp, the control unit 391 of the component storehouse 3 causes the working robot 36 to pull out the pallet 43 from the slot 445 of the magazine 44 having been conveyed to the component storehouse 3, and causes the ID reader 371 to read the pallet ID 43$d$ of this pallet 43.

Then, the control unit 391 determines the component ID 41$d$ associated with the pallet ID 43$d$ read by the ID reader 371 on the basis of the magazine preparation command Cp, and causes the working robot 36 to extract the tray 42 housing the component 41 with this component ID 41$d$ from the tray storage rack 32. The working robot places the tray 42 thereby extracted onto the pallet 43 pulled out from the slot 445 of the magazine 44. Then, the working robot 36 pushes this pallet 43 back into the slot 445.

In the above-described embodiment, the AGV 5 conveys the magazine 44. The conveyance of the magazine 44 by the AGV 5 is carried out on the basis of control by the computer 2 for the purpose of replenishing the component mounter 6 with the component 41 held in the magazine 44 prepared by the component storehouse 3. In this regard, it is preferable that the computer 2, the component storehouse 3, and the AGV 5 operate in synchronization with each other. Thus, each of the computer 2, the component storehouse 3, and the AGV 5 may be configured to check the operations of the others by sharing a status in a manner described next.

FIG. 15 shows an exemplary technique of sharing a status for synchronization between the operations of the computer, the component storehouse, and the AGV. In this example, statuses are identified with integers from "−1" to "8," and each operation indicated by a corresponding status is shown in "Meaning." When a transmission-side device (computer 2, component storehouse 3, and AGV 5) shown in a column "Write" writes a status number into a file, the file is transmitted to a receiving-side device (computer 2, component storehouse 3, and AGV 5) shown in a column "Read" and the receiving-side device reads the status written in the file. Then, the receiving-side device takes an action responsive to the status. By doing so, it becomes possible to synchronize the operations of the computer 2, the component storehouse 3, and the AGV 5 with each other.

The magazine 44 may be conveyed by an operator without depending on the AGV 5. In this case, the computer 2 uses the UI 23 to notify the operator of the magazine ID 44d of the magazine 44 to be conveyed to the component storehouse 3 and the component mounter 6. The operator conveys this magazine 44 to the component storehouse 3 and the component mounter 6 while determining the magazine ID 44d using the ID reader and determining a conveyance destination using the UI 23.

In another case, the operator may determine the remaining number of the components 41 at the component mounter 6 using the UI 23 and determine voluntarily which component 41 is to be replenished to the magazine 44 of the component mounter 6. In this case, the magazine preparation command Cp is generated on the basis of input operation to the UI 23 by the operator. By doing so, the operator can cause the component storehouse 3 to prepare the magazine 44 holding the component 41 determined to be required to be replenished in the slot 445.

In the above-described embodiment, the component 41 is replenished by inserting the pallet 43 from the magazine 44c held by the AGV 5 into the magazine 44u in the component mounter 6 using the pallet extrusion jig 45. Alternatively, the component 41 may be replenished to the AGV 5 by exchanging the magazine 44c held by the AGV 5 and the magazine 44u in the component mounter 6. In one configuration, this work of exchanging the magazines 44 may be conducted by the working robot 54 of the AGV 5. In another configuration, this work may be conducted by a carrier device such as a crane provided in the component mounter 6.

In the above-described embodiment, order of unloading the tray 42 stored in the tray storage rack 32 is not particularly mentioned. Meanwhile, in the presence of a plurality of the stored trays 42 housing the components 41 of the same type, there are variations for the order of unloading these trays 42. For example, the trays 42 may be extracted from the tray storage rack 32 in time order starting with the earliest in terms of being stored in the tray storage rack 32, and then inserted into the magazine 44. In this case, the older component 41 is to be unloaded more preferentially. In a case of storing and running the tray 42 in a used state, the trays 42 may be extracted from the tray storage rack 32 in ascending order of remaining number of the components 41 housed in the trays 42, and then inserted into the magazine 44. In this case, of the trays 42 housing a number equal to or greater than the number to be used at the component mounter 6 as a destination of replenishment in response to implementation of the production plan P, the tray 42 housing a least number of the components 41 may be extracted from the tray storage rack 32 and then inserted into the magazine 44. In another case, the trays 42 may be extracted from the tray storage rack 32 in numerical order in terms of the component ID 41d given during loading, and then inserted into the magazine 44.

The component mounter 6 can mount a component supplied from a tape feeder on a board in addition to the component 41 supplied from the tray 42. In this case, a reel on which tape housing a component is wound is loaded on the tape feeder, thereby replenishing the component to the tape feeder. At this time, if the remaining number of components in the tape loaded on the tape feeder becomes equal to or less than a predetermined threshold, the computer 2 issues a remaining number warning and informs the AGV 5 or an operator to conduct component replenishment of loading a new reel on this tape feeder.

A method of setting the replenishment timing Ts is not limited to the one given in the above-described example. Referring to the illustration in FIG. 9, for example, the replenishment timing Ts is set in the middle of the replenishment feasible time period Tw. Alternatively, the replenishment start timing Te may be set as the replenishment timing Ts. This makes it possible to replenish the component 41 readily. In another case, the computer 2 may set the replenishment timing Ts in such a manner that the replenishment timing Ts does not fall within a period of time when the AGV 5 or an operator conveys a reel for a tape feeder (in other words, a period of time when component replenishment to the tape feeder is informed).

In the illustration shown in FIG. 10, the component storehouse 3 starts conducting the work immediately on receipt of the magazine preparation command Cp. Alternatively, the magazine preparation command Cp including a work start time may be transmitted from the computer 2 to the component storehouse 3 and the component storehouse 3 may start the work at the work start time indicated by the received magazine preparation command Cp.

What is claimed is:

1. A component storage system comprising:
   a component storehouse including a tray storage part configured to store a tray housing a component, and a work implementation part, configured to hold a pallet on which the tray extracted from the tray storage part is placed, in a slot at a magazine; and
   a controller configured to control the component storehouse, wherein
   the magazine is configured to hold the component housed in the tray placed on the pallet in the slot by holding the pallet in the slot,
   the controller is configured to notify the component storehouse of a magazine preparation command indicating the component to be held in the slot of the magazine, and
   the work implementation part is configured to prepare the magazine where the component indicated by the magazine preparation command is held in the slot.

2. The component storage system according to claim 1, wherein
   the controller is configured to calculate a replenishment timing of replenishing the component to a component mounter on the basis of a production plan by which a component-mounted board is to be produced by causing the component mounter to mount the component on a board, and is configured to notify the component storehouse of the magazine preparation command indicating to implement a preparation of the magazine, where the component to be replenished at the replenishment timing is held in the slot, in conformity with the replenishment timing.

3. The component storage system according to claim 2, wherein the controller is configured to notify the component storehouse of the magazine preparation command requesting a work for preparation of the magazine where the component to be replenished at the replenishment timing is held in the slot to be started before the replenishment timing, and the work implementation part is configured to start the work for preparation of the magazine where the component indicated by the magazine preparation command is held in the slot before the replenishment timing.

4. The component storage system according to claim 3, wherein the controller is configured to calculate the replenishment timing on the basis of result of simulation conducted to predict temporal change in a remaining number of the components at the component mounter mounting the component on the board in conformity with the production plan.

5. The component storage system according to claim 2, wherein the controller is configured to calculate the replenishment timing on the basis of result of simulation conducted to predict temporal change in a remaining number of the components at the component mounter mounting the component on the board in conformity with the production plan.

6. The component storage system according to claim 2, wherein the magazine is given a magazine ID to identify the magazine, the controller is configured to notify the component storehouse of the magazine ID of the magazine as a target of the magazine preparation command and the magazine preparation command in association with each other, the component storehouse includes a magazine ID reader configured to read the magazine ID of the magazine having been conveyed to the component storehouse, and the work implementation part is configured to hold the component in the slot of the magazine given the magazine ID in response to the magazine preparation command associated with the magazine ID read by the magazine ID reader.

7. The component storage system according to claim 2, wherein the magazine is given a magazine ID to identify the magazine, the tray is given a component ID to identify a component to be placed on the tray, and the component storehouse is configured to store the magazine, cause the work implementation part to hold the component indicated by the magazine preparation command in the slot of the magazine stored in the component storehouse, and notify the controller of association between the magazine ID of the magazine and the component ID held in the slot of the magazine.

8. The component storage system according to claim 2, wherein the component storehouse further includes a pallet storage part configured to house the pallet, and the work implementation part is configured to place the tray that is the tray stored in the tray storage part and housing the component indicated by the magazine preparation command on one pallet that is the pallet stored in the pallet storage part, and then insert the one pallet into the slot, thereby preparing the magazine where the component indicated by the magazine preparation command is held in the slot.

9. The component storage system according to claim 2, wherein the pallet is given a pallet ID to identify the pallet, the component storehouse includes a pallet ID reader configured to read the pallet ID, the magazine preparation command indicates the component to be held in the slot of the magazine in association with the pallet ID of the pallet inserted in the slot, and the component storehouse is configured to read the pallet ID of the pallet inserted in the magazine having been conveyed to the component storehouse using the pallet ID reader and place the tray housing the component associated with the pallet ID by the magazine preparation command on the pallet, thereby preparing the magazine where the component indicated by the magazine preparation command is held in the slot.

10. The component storage system according to claim 2, wherein the controller is configured to cause an automatic guided vehicle to convey the magazine prepared in response to the magazine preparation command to a conveyance destination.

11. The component storage system according to claim 1, wherein the magazine is given a magazine ID to identify the magazine, the controller is configured to notify the component storehouse of the magazine ID of the magazine as a target of the magazine preparation command and the magazine preparation command in association with each other, the component storehouse includes a magazine ID reader configured to read the magazine ID of the magazine having been conveyed to the component storehouse, and the work implementation part is configured to hold the component in the slot of the magazine given the magazine ID in response to the magazine preparation command associated with the magazine ID read by the magazine ID reader.

12. The component storage system according to claim 11, wherein the tray is given a component ID to identify a component to be placed on the tray, the magazine preparation command indicates the component ID of the component to be held in the slot of the magazine and the slot in association with each other, and the work implementation part is configured to hold the component with the component ID in the slot in conformity with the association between the slot and the component ID indicated by the magazine preparation command.

13. The component storage system according to claim 1, wherein the magazine is given a magazine ID to identify the magazine, the tray is given a component ID to identify a component to be placed on the tray, and the component storehouse is configured to store the magazine, cause the work implementation part to hold the component indicated by the magazine preparation command in the slot of the magazine stored in the component storehouse, and notify the controller of association between the magazine ID of the magazine and the component ID held in the slot of the magazine.

14. The component storage system according to claim 1, wherein the component storehouse further includes a pallet storage part configured to house the pallet, and the work implementation part is configured to place the tray that is the tray stored in the tray storage part and housing the component indicated by the magazine preparation command on one pallet that is the pallet stored in the pallet storage part, and then insert the one pallet into the slot, thereby preparing the magazine where the component indicated by the magazine preparation command is held in the slot.

15. The component storage system according to claim 1, wherein the pallet is given a pallet ID to identify the pallet, the component storehouse includes a pallet ID reader configured to read the pallet ID, the magazine preparation command indicates the component to be held in the slot of the magazine in association with the pallet ID of the pallet inserted in the slot, and the component storehouse is configured to read the pallet ID of the pallet inserted in the magazine having been conveyed to the component storehouse using the pallet ID reader and place the tray housing the component associated with the pallet ID by the magazine preparation command on the pallet, thereby preparing the magazine where the component indicated by the magazine preparation command is held in the slot.

16. The component storage system according to claim 1, wherein the controller is configured to cause an automatic guided vehicle to convey the magazine prepared in response to the magazine preparation command to a conveyance destination.

17. The component storage system according to claim 1, wherein the controller is configured to inform an operator to convey the magazine prepared in response to the magazine preparation command to a conveyance destination.

18. The component storage system according to claim 1, wherein the controller is configured to inform an operator to convey the magazine prepared in response to the magazine preparation command to a conveyance destination.

19. A component storehouse comprising:

a tray storage part storing a tray housing a component; and a work implementation part configured to hold a pallet on which the tray extracted from the tray storage part is placed in a slot provided at a magazine, wherein the magazine is configured to hold the component housed in the tray placed on the pallet in the slot by holding the pallet in the slot, and the work implementation part is configured to prepare the magazine where the component indicated by a magazine preparation command is held in the slot, the magazine preparation command indicating the component to be held in the slot of the magazine.

20. A magazine preparation method comprising:

notifying a magazine preparation command indicating a component to be held in a slot of a magazine; and preparing the magazine at a component storehouse including a tray storage part storing a tray housing the component, and a work implementation part that holds a pallet on which the tray extracted from the tray storage part is placed in the slot provided at the magazine, the magazine being prepared by causing the work implementation part to hold the component indicated by the magazine preparation command in the slot.

* * * * *